United States Patent [19]

Ota et al.

[11] Patent Number: 5,506,684

[45] Date of Patent: Apr. 9, 1996

[54] PROJECTION SCANNING EXPOSURE APPARATUS WITH SYNCHRONOUS MASK/WAFER ALIGNMENT SYSTEM

[75] Inventors: Kazuya Ota; Kouichirou Komatsu, both of Tokyo, Japan

[73] Assignee: Nikon Corporation, Tokyo, Japan

[21] Appl. No.: 481,215

[22] Filed: Jun. 7, 1995

Related U.S. Application Data

[63] Continuation of Ser. No. 299,305, Sep. 1, 1994, abandoned, which is a continuation-in-part of Ser. No. 934,247, Aug. 25, 1992, abandoned, which is a continuation-in-part of Ser. No. 863,675, Apr. 1, 1992, abandoned.

[30] Foreign Application Priority Data

| Apr. 4, 1991 | [JP] | Japan | 3-71789 |
| Aug. 30, 1991 | [JP] | Japan | 3-245054 |
| Sep. 2, 1993 | [JP] | Japan | 5-218910 |

[51] Int. Cl.$^6$ .............. G01B 11/00; G01B 9/02
[52] U.S. Cl. .............. 356/401; 356/349; 356/363; 250/548
[58] Field of Search .............. 356/363, 400, 356/401, 399, 356, 349; 250/548

[56] References Cited

U.S. PATENT DOCUMENTS 5,214,489  5/1993  Mizutani et al. .............. 356/401

*Primary Examiner*—Frank Gonzalez
*Assistant Examiner*—Robert Kim
*Attorney, Agent, or Firm*—Shapiro and Shapiro

[57] ABSTRACT

A scanning exposure apparatus has a mask (reticle) and a photosensitive substrate (a wafer) in an imaging relationship across a projection optical system. A mask stage and a wafer stage are moved simultaneously in first (X) direction with a speed ratio corresponding to the magnification of projection, so that a shot area of the photosensitive substrate is scan-exposed to an original pattern of the mask.

The mask is provided, over the scanning range of the original pattern, with mask gratings, each composed of plural grating elements arranged at a predetermined pitch along the first (X) direction. The photosensitive substrate is provided with substrate gratings corresponding to said mask gratings. The positional aberration between said mask gratings and the substrate gratings is detected, through the projection optical system, by positional aberration detecting means.

At the scanning exposure, either of the mask stage and the substrate stage is driven in the first (X) direction at a constant speed, by first drive control means. The other stage is controlled by second drive control means in such a manner that the relative positional aberration detected by the positional aberration detecting means in the course of movement of the stage, driven by the first drive control means, remains at a predetermined value.

27 Claims, 18 Drawing Sheets

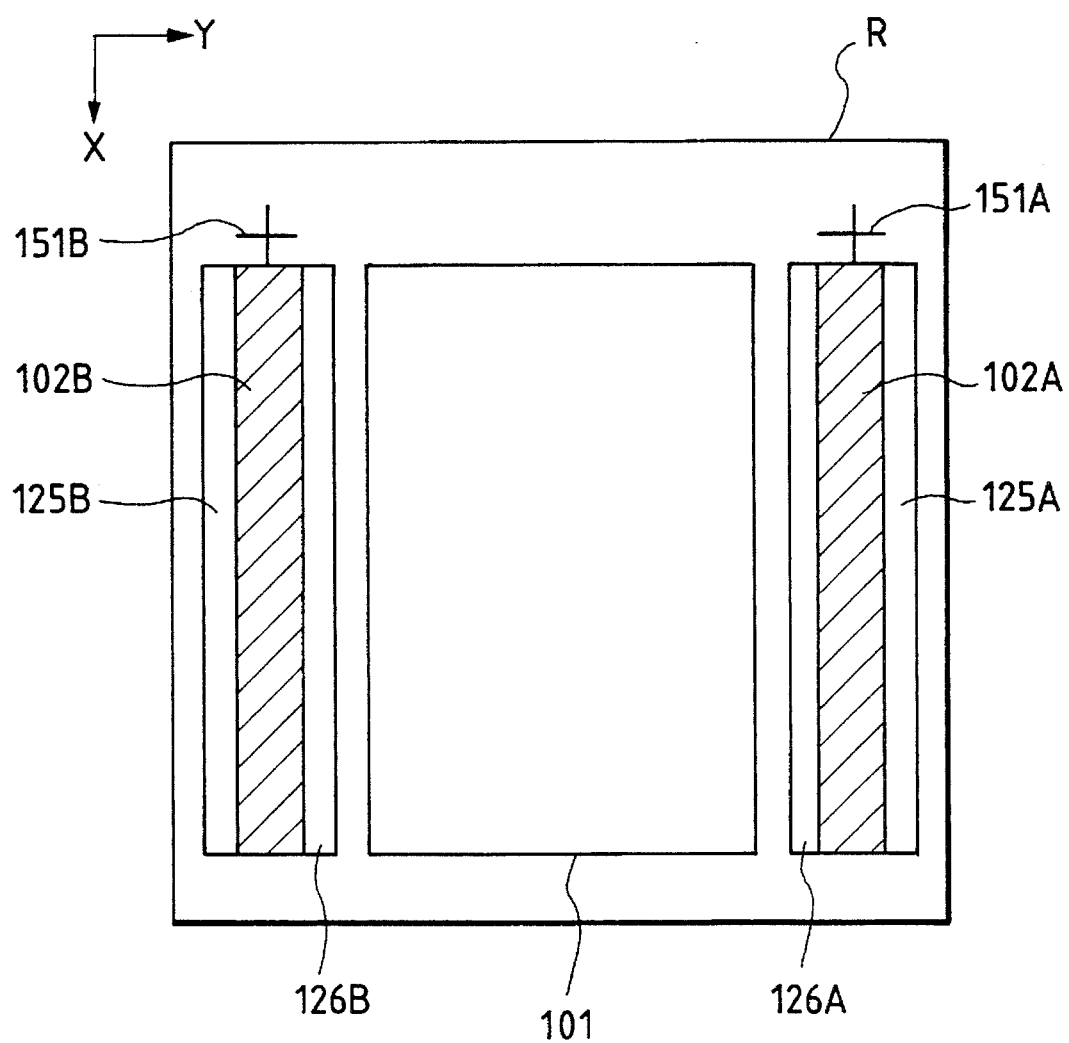

PROJECTION SCANNING EXPOSURE APPARATUS WITH SYNCHRONOUS MASK/WAFER ALIGNMENT SYSTEM

This is a continuation of application Ser. No. 08/299,305 filed Sep. 1, 1994, which is a continuation-in-part of application Ser. No. 07/934,247 filed Aug. 25, 1992, which is a continuation-in-part of application Ser. No. 07/863,675 filed Apr. 1, 1992, all now abandoned.

BACKGROUND OF THE INVENTION

1. Field of the Invention

The present invention relates to a projection scanning exposure apparatus which, at the projection of a pattern of a mask onto a photosensitive substrate, simultaneously scans said mask and said photosensitive substrate with respect to a projection optical system.

2. Related Background Art

In the conventional scanning exposure apparatus there is known a system employing a 1:1 reflective projection optical system and combining a mask stage supporting a mask and substrate stage supporting a photosensitive substrate (wafer) to a common movable column, thereby scanning said mask and substrate at a same speed. Said 1:1 reflective projection optical system, featured by limited chromatic aberration over a wide wavelength region due to the absence of refractive elements (lenses), enables high-speed scanning exposure by employing two or more spectral lines (for example g- and i-lines) from the light source (mercury lamp) for increasing the intensity of the light. In such reflective projection optical system, since the astigmatisms in the sagittal (S) image plane and in the meridional (M) image plane can be made zero only in a limited range around a certain image height from the optical axis of said optical, the exposing light illuminating the mask assumes the form of a part of an annular area, or so-called arc-shaped slit.

In such 1:1 scanning exposure apparatus (mirror projection aligner), if the image of the mask pattern projected onto the wafer does not constitute the mirror image of said mask pattern, the exposure operation can be completed by a one-dimensional scanning motion of a movable column to which the mask and the wafer are connected in a mutually aligned manner.

In a 1:1 projection optical system in which the image of the mask pattern projected on the wafer constitutes the mirror image of said mask pattern, the mask stage and the wafer stage have naturally to be moved in mutually opposed directions with a same speed.

Also in the conventional exposure systems, it is already known to incorporate a refractive element for increasing or decreasing the magnification of the projected image and to scan the mask stage and the wafer stage with a speed ratio corresponding to said magnification.

In such case, the projection optical system consists of a reflective element and refractive elements, or of refractive elements only. An example of a reduction projection system consisting of a reflective element and refractive elements is disclosed in U.S. Pat. No. 4,747,678, and a scanning exposure apparatus utilizing said projection optical system is commercialized as a step-and-scan aligner by Perkin and Elmer Co. under a commercial name Micrascan.

Furthermore, a method of step-and-scan exposure with a reduction projection optical system capable of full-field projection is disclosed in U.S. Pat. No. 4,924,257.

In such scanning exposure apparatus with non-unity projected magnification, it is necessary to precisely move the mask stage and the wafer stage in scanning motion with a speed ratio corresponding to the magnification, and to maintain the aberration of the mask pattern and the pattern on the wafer in the course of scanning exposure within a predetermined tolerance. The tolerable aberration, approximately defined by the minimum line width on the wafer, is only about $1/5$ to $1/10$ in case of forming, for example, a pattern with a line width of about 0.8 μm.

Consequently, it is desirable that the positional aberration between the mask and the wafer can be constantly monitored during the scanning exposure.

As a conventional example, U.S. Pat. No. 4,697,087 discloses a method of correcting the mutual positional relationship of the reticle and the wafer (including magnification error and rotational error) by detecting plural broken chevron-shaped reticle marks formed on the reticle and plural broken chevron-shaped wafer targets formed on the wafer, in succession immediately before and during the scanning exposure.

The above-mentioned method is schematically illustrated in FIG. 1. Plural broken chevron-shaped marks RM1, RM2, RM3 formed in the peripheral area of a reticle R and plural broken chevron-shaped marks WM1, WM2, WM3 formed outside a shot area SA on a wafer W are mutually scanned by slit illuminating light beams AIL in broken chevron-shaped arrangement. In FIG. 1, for the purpose of simplicity, the magnification of the projection optical system is assumed as unity, and the reticle R and the wafer W are moved in mutually opposed directions as indicated by arrows. The amount of illuminating light beams AIL normally reflected or scattered by the reticle marks RM1, RM2, RM3 and the wafer marks WM1, WM2, WM3 is defined as a function of time as shown in FIGS. 2A and 2B.

FIG. 2A indicates an example of signal obtained by photoelectric detection of the light reflected from the reticle marks, and FIG. 2B indicates an example of signal obtained by photoelectric detection of the light scattered from the wafer marks. The alignment of the reticle and the wafer can be attained by regulating the scanning speeds and relative position of the reticle R and the wafer W in such a manner that a pulse P1 in the reticle signal matches in time paired pulses P2, P3 in the wafer signal, then a pulse P4 matches paired pulses P5, P6 and a pulse P7 matches paired pulses P8, P9. However, if these marks are detected for the first time in the course of scanning exposure, the precise alignment cannot be attained at the start of the scanning exposure. Therefore, a preliminary scanning is conducted as shown in FIG. 1 prior to the actual exposure, and the alignment error ΔX in the scanning exposure direction is determined from the difference between the average position of the pulses P1, P4, P7 in the reticle signal and the average position of the pulses P2, P3, P5, P6, P8, P9 in the wafer signal. Also the alignment error ΔY in the orthogonal direction can be determined from the positions of the pulses P1–P6 as follows:

$$\Delta Y=((P5+P6)-(P2+P3))-(P4-P1).$$

In the conventional method explained above, since the signal wave is obtained only when a very fine slit-shaped light beam AIL crosses each alignment mark, it is indispensable, for attaining a high alignment precision, to detect the positions of plural marks and to calculate the average position thereof. Consequently a preliminary scanning is inevitable before the main scanning for exposure, and the throughput is therefore scarificed. Also in the conventional mark arrangement, even if the precision of detection of each mark is sufficient, the marks only have a very small width in the scanning direction. Consequently the pulses are inevitably intermittent in the alignment signal, and the alignment error is practically not determined during the interval of the pulses.

For this reason, in the interval between the plural marks arranged in the scanning direction, there has to be relied on the data obtained by laser interferometers for measuring the positions of the scanning stages for moving the reticle R and the wafer W.

SUMMARY OF THE INVENTION

In consideration of the foregoing, an object of the present invention is to dispense with, as far as possible, the scanning for alignment prior to the main scanning for exposure.

Another object of the present invention is to effect speed control not on both but on either of the reticle and the wafer, and moving the other by tracking the former, thereby simplifying the control.

Still another object of the present invention is to attain highly precise alignment of the reticle and the wafer in the course of exposure, regardless of the scanning (moving) direction of the reticle and the wafer.

The present invention provides a scanning exposure apparatus having a mask (reticle R) and a photosensitive substrate (wafer W) in an imaging relationship across a projection optical system PL, and moving a mask stage 6 and a wafer stage 9 simultaneously in a same direction (for example X-direction) with a speed ratio corresponding to the magnification of projection, thereby scan-exposing a shot area SA of the photosensitive substrate W to an original pattern PA of the mask R.

The mask R employed in the present invention is provided, over the scanning range of the original pattern PA, with mask gratings RMa, RMb, each composed of plural grating elements arranged at a predetermined pitch along the first (X) direction. Also the photosensitive substrate W is provided with substrate gratings WMa, WMb corresponding to said mask gratings RMa, RMb. The positional aberration between said mask gratings RMa, RMb and said substrate gratings WMa, WMb is detected, through the projection optical system PL, by positional aberration detecting means 20–27.

At the scanning exposure, either of the mask stage 6 and the substrate stage 9 is driven in the first (X) direction at a constant speed, by first drive control means (for example substrate stage drive system 12).

The other stage (for example mask stage 6) is controlled by second drive control means 28 in such a manner that the relative positional aberration detected by the positional aberration detecting means 20–27 in the course of movement of the stage 9, driven by said first drive control means 12, remains at a predetermined value.

In the scanning exposure of the present invention, the wafer stage for example is controlled at a constant speed while the mask stage is servo controlled in such a manner that the alignment error detected by the positional error detecting means alignment system) always remains at a predetermined value. Consequently the constant speed control is required only for either stage, and the other stage only needs to track the former.

Also the alignment error can be continuously determined during the scanning exposure, since a diffraction grating is provided over the scanning range in each of the mask and the wafer.

According to the present invention, as explained in the foregoing, the scanning is conducted by continuously detecting the relative positional error between the reticle (mask) and the wafer (photosensitive substrate) by the alignment sensor and driving either of the reticle and the wafer with the speed control mode while driving the other in the servo (tracking) control mode in such a manner that the positional aberration obtained in the alignment sensor is maintained at a predetermined value. Therefore, even if a fluctuation occurs in the speed of the stage driven in the speed control mode, the magnification error in the scanning direction (increase or decrease in the dimension of the transferred image in the scanning direction) can be maintained within the precision of measurement detected by the alignment sensor. Consequently, even if a shot area itself on the wafer is non-linearly deformed in the scanning direction by the influence of the wafer process or an unevenness in the scanning at the exposure of said shot, an extremely high alignment precision can be obtained over the entire shot area as long as the tracking is conducted based on the measurement signal from the alignment sensor.

Also as shown in FIG. 12, the grating marks may be positioned intermittently in the scanning direction, in order to save the space for said marks, in case the mark reformation is required in a multilayered IC manufacturing process. As long as the interval of the grating marks is retained reasonably narrow, the dead time from the end of detection of a grating mark to the start of detection of a next grating mark can be made shorter than the cycle time of air fluctuation in the laser interferometer, so that there can be attained a precision equivalent to that when the grating mark is continuously provided over the entire scanning range.

Besides, in case the stage movements are conducted according to the laser interferometer for the wafer stage or for the reticle stage during such dead time in which the interference beat signal is not obtained from any grating mark, the system of the present invention is less influenced by air fluctuation than in the conventional system.

Furthermore, in case of positioning plural alignment sensors along the scanning direction and providing the grating marks intermittently as shown in FIG. 13, it is possible to constantly detect the positional aberration by either of said alignment sensor or to extremely shorten the dead time of no mark detection by any alignment sensor, by selecting the pitch of said sensors differently from that of said marks. Consequently the precision of alignment and overlay can be significantly improved in comparison with the conventional systems.

Furthermore, the alignment system of the present invention for scanning exposure can be directly applicable also to the exposure apparatus of the conventional step-and-scan system.

Further, another scanning exposure apparatus according to the present invention, is provided on one of a mask stage and a substrate stage with a movable member which can slightly move a mask or a photosensitive substrate, relative to the one of the mask stage and the substrate stage in the scanning direction thereof, and forms mask marks over a substantially entire range where an original pattern is formed on the mask in the scanning direction thereof while forms substrate marks in a substantially entire shot range on the photosensitive substrate in the scanning direction. Further, it is also provided with means for measuring a positional deviation between the mask marks and the substrate marks in the scanning direction, and means for driving the movable member so as to maintain the positional deviation measured by the measuring device at a predetermined value, during a period in which the mask stage and the substrate stage are driven in accordance with a speed ratio corresponding to a projecting magnification of a projection optical system in order to transfer the original pattern from the mask onto the shot area on the photosensitive substrate. With this arrangement, superposing exposure can be carried out with a high degree of accuracy even though the photosensitive substrate (shot area) is deformed.

Further, another scanning exposure apparatus according to the present invention divides an original pattern on a mask into a plurality of partial patterns having a width substantially equal to the width of an illumination area in the scanning direction, which are arranged in the scanning direction, and further, incorporates mask marks on the plurality of partial patterns, respectively, while incorporates substrate masks on a plurality of partial areas corresponding to the plurality of partial patterns on the mask, respectively, in the shot area on the photosensitive substrate. Further, it is provided with means for measuring a positional deviation between a mask mark incorporated to one of the plurality of mask patterns on the mask and a substrate mark incorporated on one of the plurality of partial areas in the shot area on the photosensitive substrate, corresponding to the one of the plurality of partial patterns, and means for driving the mask and the photosensitive substrate, relative to each other, so as to maintain the positional deviation measured by the measuring device at a predetermined value when a mask stage is driven so as to successively move the plurality of partial patterns on the mask into the illumination area in order to transfer the original pattern from the mask onto the shot area on the photosensitive substrate. With this arrangement, superposing exposure can be carried out with a high degree of accuracy even though the photosensitive substrate (shot area) is deformed.

BRIEF DESCRIPTION OF THE DRAWINGS

FIG. 23 is a view illustrating an arrangement of a reticle shown in FIG. 22.

DESCRIPTION OF THE PREFERRED EMBODIMENTS

Figure 3:
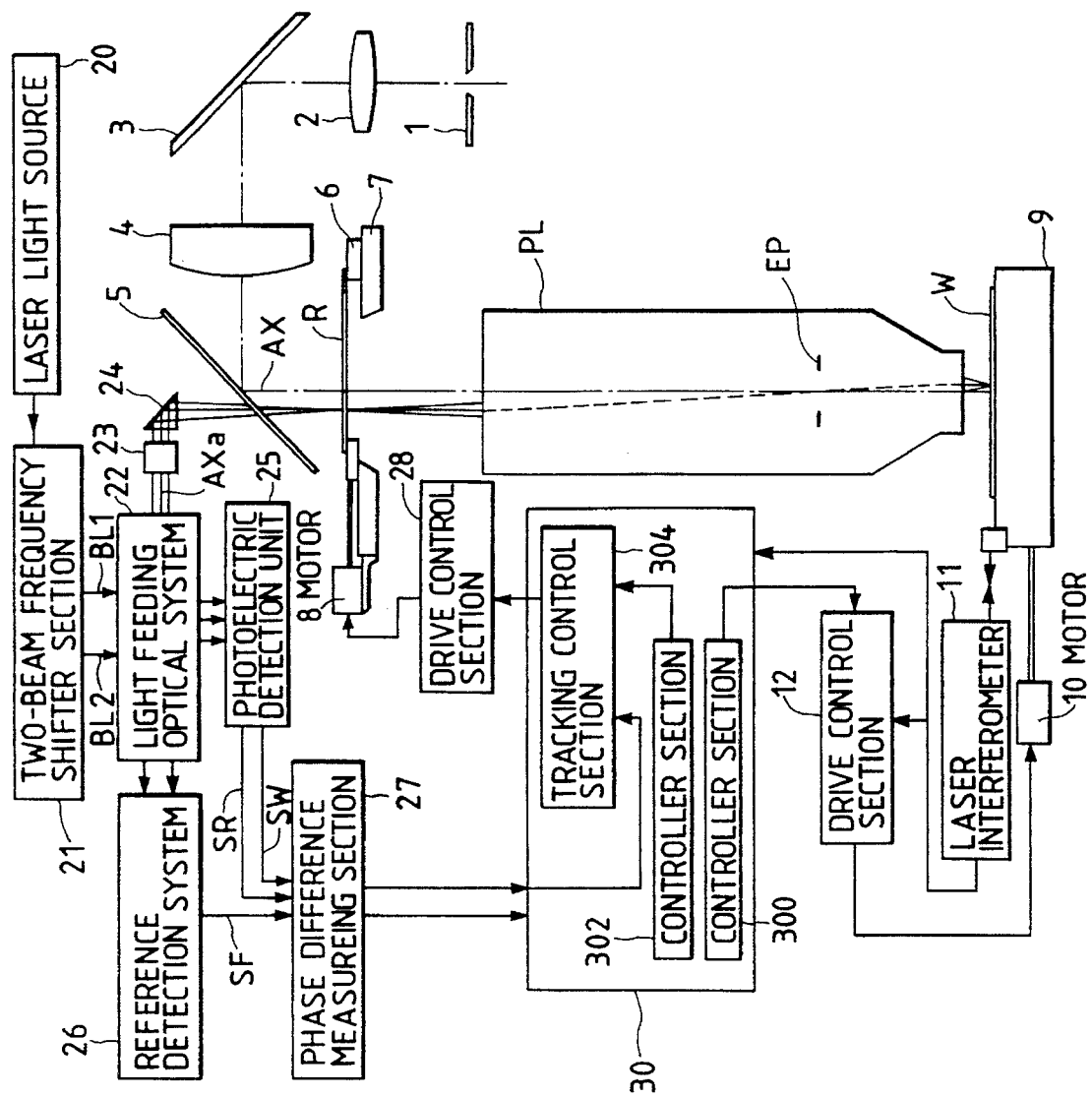
FIG. 3 is a block diagram of a scanning projection exposure apparatus embodying the present invention.
Figure 4:
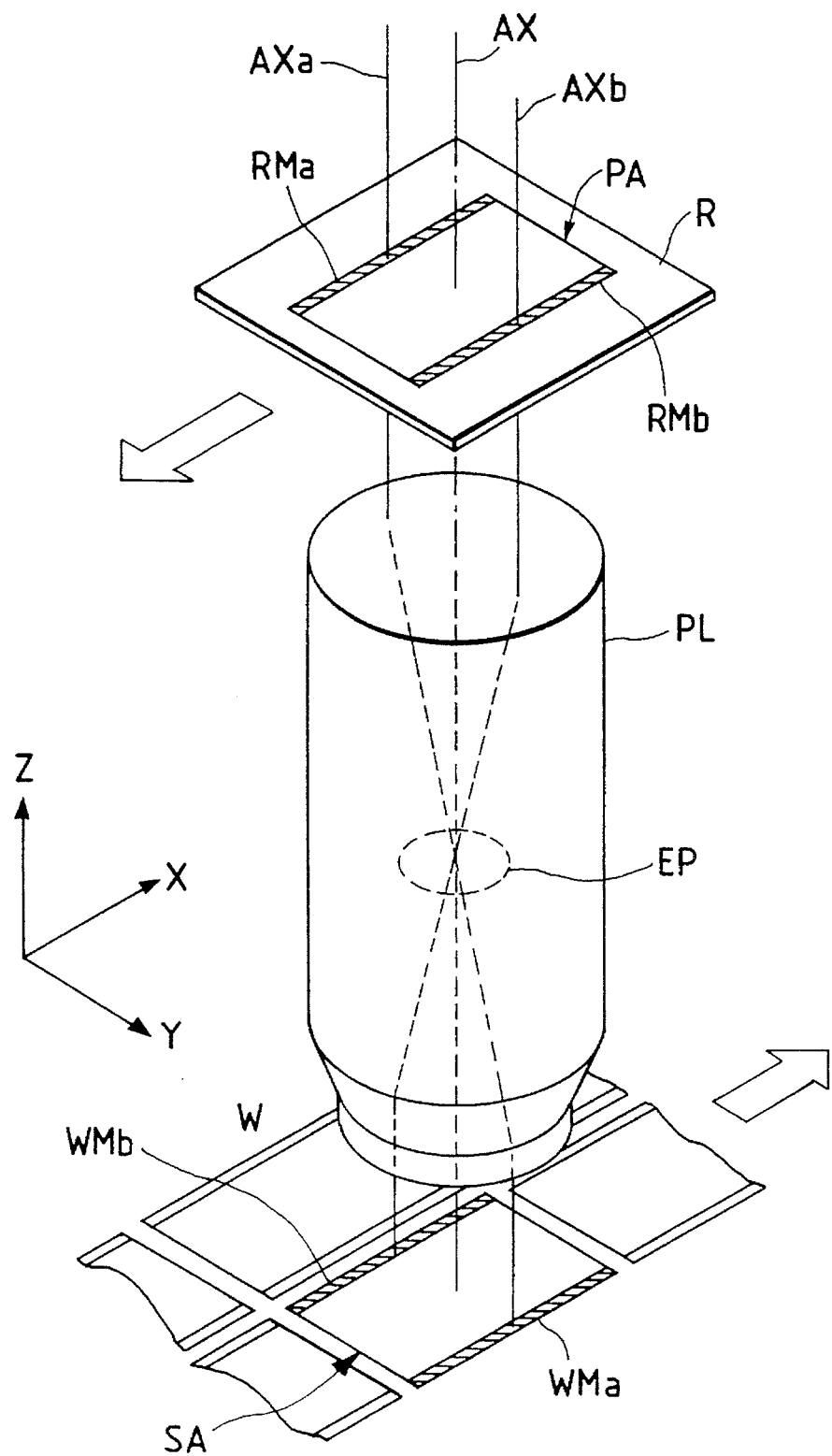
FIG. 4 is a perspective view showing the alignment system in the apparatus shown in FIG. 3.

FIG. 3 shows the structure of a step-and-scan exposure apparatus constituting a first embodiment of the present invention, and FIG. 4 is a schematic perspective view showing the mode of scanning exposure. In FIG. 3, the projection optical system PL is, as an example, a full-field ⅕ reduction projection lens composed solely of conventional refractive element, and is telecentric at the reticle side and at the wafer side.

The illuminating light from an exposing light source is made uniform in intensity for example by a fly's eye lens, and illuminates a reticle blind 1 serving as an illuminating field diaphragm. Said reticle blind 1 is provided with a slit aperture for illuminating the reticle R in slit shape. The longitudinal direction of said slit apertures lies in the Y-direction, which is perpendicular to the scanning (X) direction of the reticle R and the wafer W. The illuminating light, passing through the slit aperture of the blind 1, is guided through a lens system 2, a mirror 3, a condenser lens 4 and a dichroic mirror (or a beam splitter) 5 and reaches the reticle R. Said blind 1 is optically conjugate with the pattern bearing face (face opposed to the projection lens PL) of the reticle R, with respect to the synthesized system consisting of the lens system 2 and the condenser lens 4, whereby the image of said slit aperture is focused on said reticle R.

It is also assumed that the center of said slit aperture lies on the optical axis AX of the projection lens PL and the illuminating optical system (lens system 2, condenser lens 4, etc.).

The reticle R is supported, by suction, on a reticle stage 6 which can be moved at least in the X-direction. Said reticle stage 6 effects a scanning motion in the X-direction on a column 7, by means of a motor 8. Though vernier movement mechanisms for Y and θ directions are required for the alignment of the reticle R, these mechanisms are omitted from the illustration and the description. The image of a pattern, present in the slit illumination area on the reticle R is projected and focused by the projection lens PL onto the wafer W. Said wafer W is placed on a wafer stage 9 which is two dimensionally (X and Y directions) movable and is driven by a motor 10. A laser interferometer 11 measures, in succession, the change in the coordinate position of the wafer stage 9, and also releases speed signals indicating the moving speeds of said wafer stage 9 in the X- and Y-directions. A drive control unit 12 controls the motor 10 with an optimum drive pattern, based on the positional information and the speed signals from said laser interferometer 11. In the present embodiment, the scanning exposure is executed by the movement of the wafer stage 9 in the X-direction while the stepping motion is conducted in the Y-direction, but these directions may naturally be interchanged.

Though not illustrated in FIG. 3, the coordinate position, rotational (yawing) error etc. of the reticle stage 6 are measured by a laser interferometer.

Now reference is made to FIG. 4, for explaining an example of the arrangement of alignment marks formed on the reticle R and the wafer W.

As shown in FIG. 4, the reticle R and the wafer W are moved for scanning in mutually opposite directions along the X-direction. The reticle R is provided with grating marks RMa, RMb, positioned in street line areas extending in the X-direction outside a pattern area PA and each consisting of plural grating elements arranged with a constant pitch in the X-direction, over the scanning range. Said grating marks RMa, RMb are mutually separated in the Y-direction across the pattern area PA, but the grating elements therein mutually coincide in the X-direction.

On the wafer W there are formed plural shot areas SA, in each of which a similar grating mark WMA is formed in a street line area corresponding to the grating mark RMa of the reticle R, and a similar grating mark WMb is formed in a street line area corresponding to the grating mark RMB.

The relative positional aberration in the X-direction between the grating mark RMa of the reticle R and the grating mark WMa of the wafer W is detected through an alignment optical system having an optical axis AXa, while that between the grating mark RMb of the reticle R and the grating mark WMb of the wafer W is detected through an alignment optical system having an optical axis AXb.

These optical axes AXa, AXb cross the optical axis AX at the center of the pupil plane EP of the projection lens PL.

Now reference is again made to FIG. 3 for explaining the alignment system and the control system. In the present embodiment, there is employed the interference fringe alignment method, adapted for detecting the positional aberration, in the direction of pitch, of the grating marks on the reticle R and the wafer W. Said interference fring alignment method will be explained only briefly, as it is disclosed for example in U.S. Pat. No. 5,004,348 and U.S. patent application Ser. No. 483,820 filed Feb. 23, 1990.

A linearly polarized coherent laser beam from a laser light source 20, such as a He—Ne laser, a He—Cd laser or an Ar ion laser enters a beam-splitting frequency shifter 21 to generate two beams BL1, BL2. with a frequency difference Δf. The upper limit of said frequency difference Δf is determined by the frequency response of the photodetector receiving the light from the alignment marks, and is practically not exceeding 100 kHz, for example about 50 kHz, in case of a semiconductor sensor. However, a relatively high frequency can be selected for a photomultiplier or the like.

Said two light beams BL1, BL2 are distributed, by a forwarding optical system 22, to plural alignment optical systems. In FIG. 3 there is shown an objective lens 23 and a front mirror 24 constituting an alignment optical system, and the optical axis of said objective lens 23 coincides with either of the optical axes AXa, AXb shown in FIG. 4. The beams BL1, BL2 enter the objective lens 23 in symmetrically eccentric manner with respect to the optical axis thereof, then guided through the mirror 24 and a dichroic mirror 5 and mutually cross, in parallel beam state, on the pattern bearing surface of the reticle R present at the focal position of the objective lens 23. Said crossing beams generate one-dimensional interference fringes on the grating mark RMa or RMb on the reticle R.

The two light beams passing through a transparent part of the reticle R cross each other, through a projection lens PL, on the grating mark WMa or WMb on the wafer W to generate one-dimensional interference fringes.

Due to the frequency difference Δf between the two light beams, said interference fringes flow in the direction of pitch of the fringes with a speed proportional to Δf. When the incident directions of two light beams are so determined that the direction of pitch of each grating mark coincides with that of the interference fringes and the crossing angle of said two light beams are so determined that the pitch of the grating mark and that of the interference fringes have a predetermined relationship (for example, an integral ratio), each grating mark generates perpendicularly interference light of a beat frequency same as the frequency difference Δf. Said interference light becomes lighter and darker with said beat frequency Δf, and said beat frequency Δf does not vary even if the crossing area of the grating mark and the two incident light beams is slightly displaced in the X-direction.

The interference lights from the grating marks are guided, through the mirrors 5, 23 and the objective lens 23, to a photoelectric detection unit 25 for generating sinusoidal detection signals SR, SW. Said signal SR is obtained by photoelectric detection of the interference light from the grating mark RMa or RMb of the reticle R, while the signal SW is obtained by photoelectric detection of the interference light from the grating mark WMa or WMb of the wafer W, and both signals have a frequency Δf when the reticle R and the wafer W are both stopped. However, if the grating marks of the reticle R and the wafer W are mutually displaced in the direction of pitch, there is generated a phase difference Δφ between the two signals SR and SW. Said phase difference Δφ is detected by a phase difference measuring unit 27, which calculates the amount of positional aberration corresponding to said phase difference. The detectable phase difference is usually within a range of ±180°, corresponding to a positional aberration of ±Pg/2 (μm) or ±Pg/4 (μm) wherein Pg (μm) is the pitch of the grating mark.

A main control unit 30 receives said amount of positional aberration, and sends correction values, in succession, to a drive control unit 12 for the wafer stage 9 or a drive control unit 28 for the reticle stage 6.

In the conventional interference fringe alignment method explained above, the main controller 30 is simply required to drive the motor 8 or 10 for moving the reticle stage 6 or the wafer stage 9 until said phase difference reaches a predetermined value. However, the determination of the phase difference of the signals SR, SW even during the scanning exposure with the high-speed movements of the reticle R and the wafer W as in the present embodiment bring about another difficulty. More specifically, since the grating mark continuously moves in the course of scanning exposure with aspeed v (mm/s) in the direction of pitch with respect to the crossing area of two incident light beams, the interference light generated from the grating mark is influenced by Doppler effect, whereby the frequency of the detection signals SR, SW is significantly aberrated from Δf. The frequency fs (kHz) of the signals SR, SW is given as follows, as a function of the moving speed v (mm/s) of the grating mark with a pitch Pg:

$$fs=\Delta f+2\ v/Pg$$

wherein the beat frequency Δf is 50 kHz.

For example, for Pg=8 μm, the frequency fs of the signals SR, SW becomes 25 kHz for a speed v=−100 mm/s, or 75 kHz for a speed v=+100 mm/s.

This fact poses a certain limitation on the scanning speed of the reticle stage 6 and the wafer stage 9. For example, the scanning speed v may be selected at such low level that the frequency fs can be maintained at a valur enabling satisfactory measurement of phase difference. Otherwise the scanning exposure may always be conducted in the +X direction, avoiding the −X direction in which the frequency fs becomes lower.

For achieving a simpler alignment operation during the scanning motion in consideration of the above-explained phenomena, the main control unit 30 of the present embodiment is provided with a control unit 300 for speed and position, for driving the wafer stage 9 with a controlled constant speed, a control unit 302 for speed and position for driving the reticle stage 6 with a controlled constant speed, and a tracking scan control unit 304.

In the normal positioning of the reticle only, such as so-called reticle alignment or in the normal positioning of the wafer only, such as so-called wafer global alignment or EGA (enhanced global alignment disclosed in U.S. Pat. No. 4,780,617), the control units 300, 302 independently function in the conventional manner. In the scanning exposure, said control units 300, 302 mutually cooperate to control the relative position and speed of the reticle stage 6 and the wafer stage 9.

Figure 1:
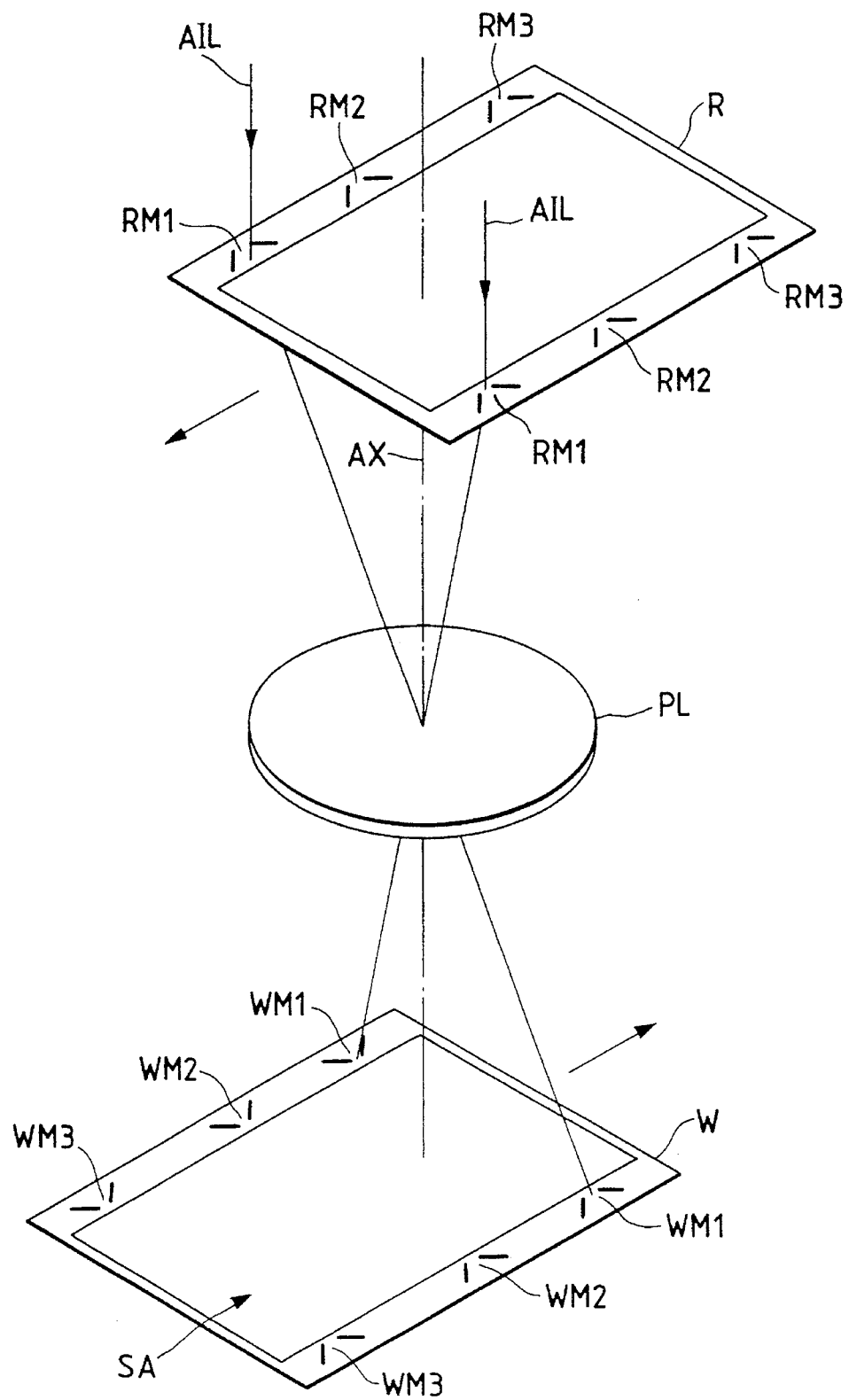
FIG. 1 is a perspective view showing the alignment system in a conventional step-and-scan exposure apparatus.
Figure 2A:
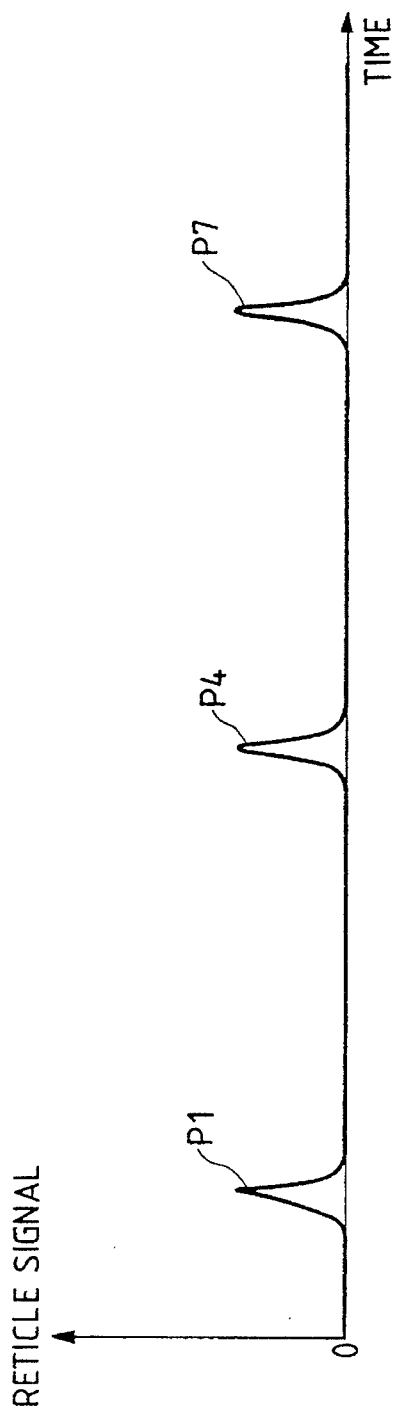
FIGS. 2A and 2B are wave form charts showing alignment signals obtained in the alignment system shown in FIG. 1.
Figure 2B:
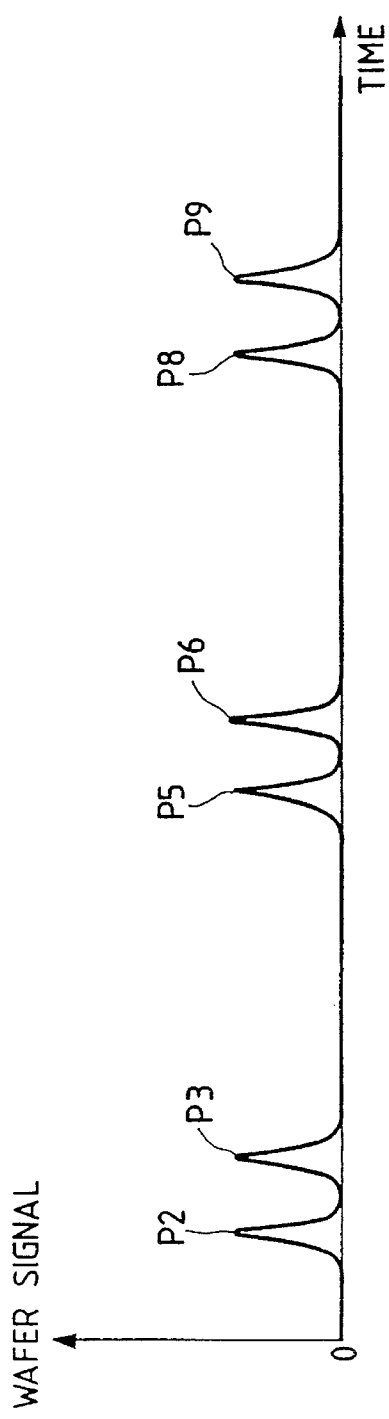

Such coordinated control is executed also in the conventional apparatus shown in FIG. 1.

In the present embodiment, there is further provided the tracking scan control unit 304, and the ordinary coordinated control and tracking control are rendered selectable. In said tracking control, the wafer stage 9 is simply controlled at a constant speed, while the drive control unit 28 for the reticle stage 6 is servo controlled in such a manner that the positional aberration released in succession from the phase difference measuring unit 27 remains always at a constant value. It is naturally possible also to drive the reticle stage 6 at a constant speed and to effect tracking control on the wafer stage 9.

As explained in the foregoing, the present embodiment, utilizing a fact that the signals SR, SW are continuously obtained during the scanning exposure or that the variation in the relative positional aberration between the reticle R and the wafer W is continuously detected, scans either of the reticle and the wafer at a constant speed and controls the other so as to follow the scanning motion of the former.

In FIG. 3, a reference detection system 26 is provided for detecting the beat frequency Δf of the two beams BL1, BL2, and its detection signal is supplied, as a sinusoidal reference signal SF of the frequency Δf, to the phase difference measuring unit 27.

Said phase difference measuring unit 27 can determine the aberration in the initial position of the reticle R from the phase difference between the reference signal SF and the detection signal SR, and the aberration in the initial position of the wafer W from the phase difference between the reference signal SF and the detection signal SW.

The phase difference measuring unit 27 is further provided with a circuit for detecting the variation in frequency, and is therefore capable of directly detecting the variation in speed of the reticle stage 6 or the wafer stage 9 from the movement of the grating mark, by quantitiatively detecting the variation in frequency of the detection signal SR or SW with respect to the reference signal SF.

In the present embodiment, as shown in FIG. 4, two alignment systems (optical axes AXa and AXb) are provided for detecting the grating marks RMa, RMb formed on both sides of the pattern area PA and the grating marks WMa, WMb on both sides of the short area SA. Therefore, the change in the relative rotational error between the reticle R and the shot area SA of the wafer W can be immediately determined, in the course of scanning exposure, by calculating the difference between the positional aberration ΔXa obtained from the alignment system with the optical axis AXa (hereinafter called alignment unit XA) and the positional aberration ΔXb obtained from the alignment system with the optical axis AXb (hereinafter called alignment unit XB) for example by a digital subtracting hardware circuit.

Also for said relative rotational error, there is defined a certain tolerance depending on the size or minimum line width of the pattern area PA or the shot area SA, and, in case said rotational error exceeds said tolerance, it is desirable to effect feedback control on a Δθ mechanism for rotating the reticle stage 6 by a small amount thereby correcting such rotational error on real-time basis in the course of scanning exposure.

In such case, the rotational center of said Δθ mechanism preferably coincides with the center of the image of the slit aperture of the blind 1, projected onto the reticle R.

Figure 5:
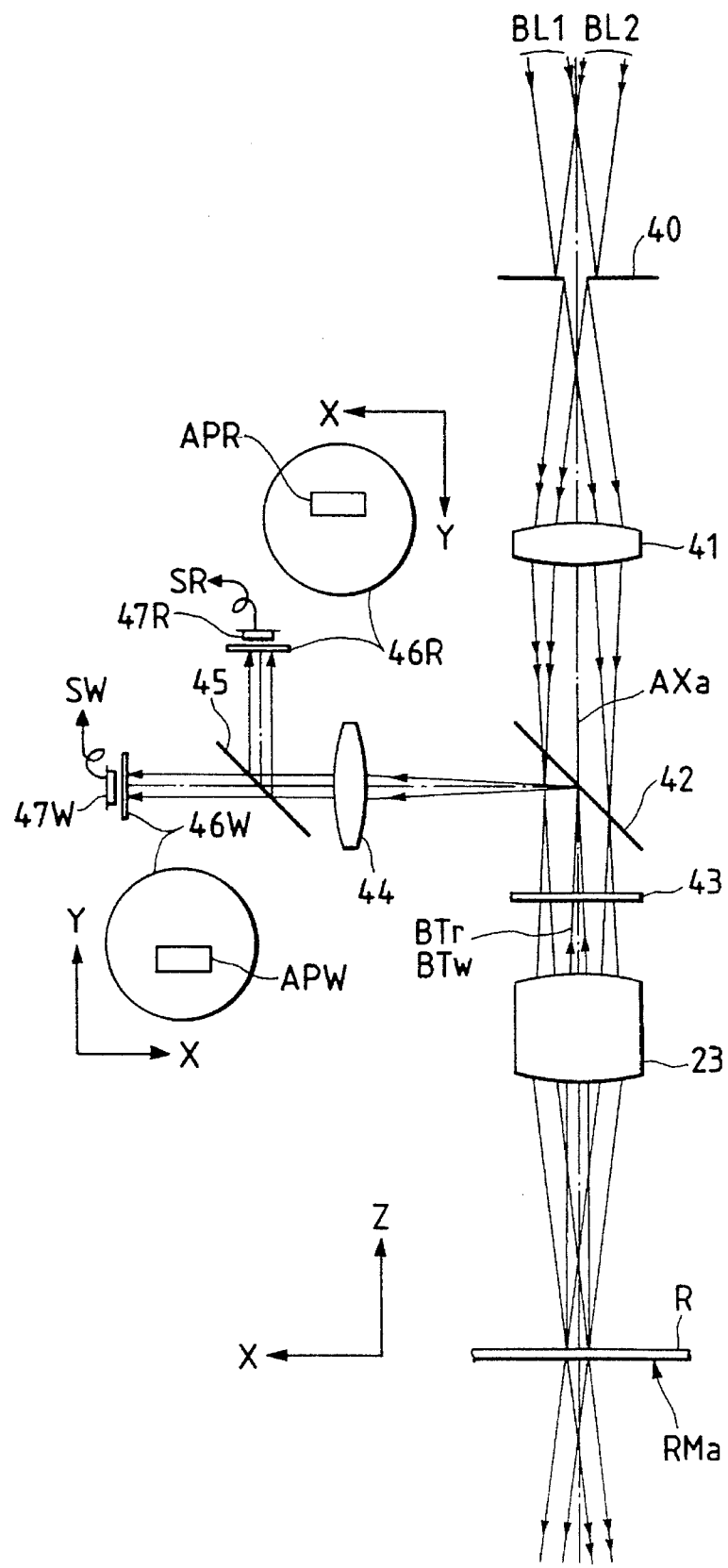
FIG. 5 is a view showing the structure of the alignment system in the apparatus shown in FIG. 3.

In the following there will be explained an example of the forwarding optical system 22 and the photoelectric detection unit 25 shown in FIG. 3, with reference to FIG. 5. Referring to FIG. 5, the two light beams BL1, BL2 mutually cross on an illuminating field diaphragm 40, and are limited to an illuminating area of a predetermined size. The limited two light beams are guided through a lens system 41, a polarizing beam splitter 42 and a ¼ wavelength plate 43, and enter the objective lens 23. As will be apparent from FIG. 5, the diaphragm 40 and the grating mark RMa of the reticle R are mutually conjugate with respect to the synthesized system of the lens 41 and the objective lens 23. Said two light beams BL1, BL2 converge, forming beam waists, on a Fourrier conversion plane (conjugate with the pupil EP of the projection lens PL) in the Fourrier space between the lens system 41 and the objective lens 23, and the principal rays of said beams BL1, BL2 become parallel to and mutually symmetrical with respect to the optical axis AXa in said Fourrier space.

The two light beams BL1, BL2 are almost completely transmitted by the polarizing beam splitter 42, then converted into circularly polarized light beams rotating in the same direction by the ¼ wavelength plate 43, further converted into two parallel beams by the objective lens 23 and mutually cross at the grating mark RMa. The arrangement of said mark RMa is shown in FIG. 4, but, in practice, said mark is displaced in the non-measuring direction (perpendicular to the direction of grating pitch).

Figure 6:
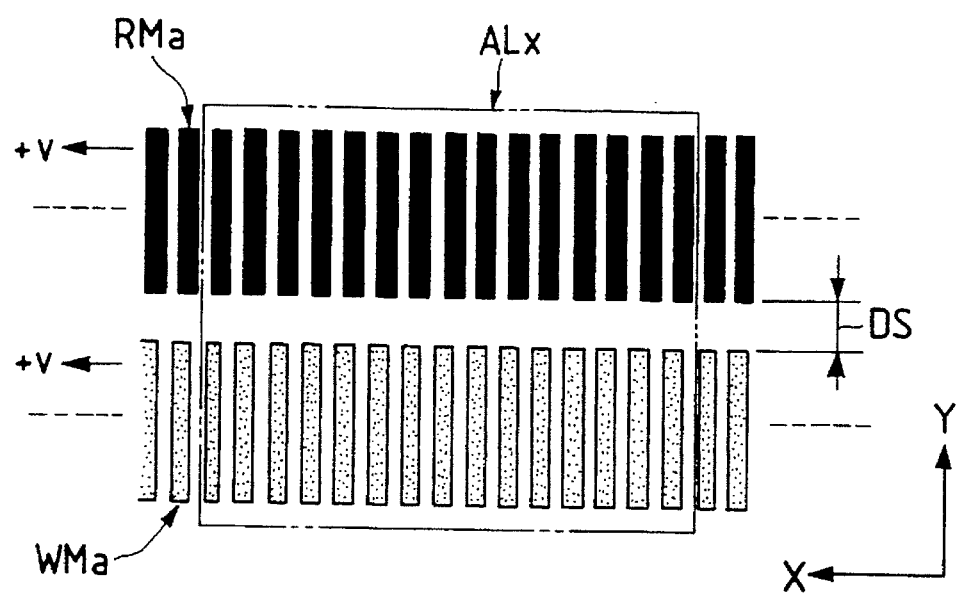
FIG. 6 is a view of grating marks on the reticle and wafer to be employed in the apparatus shown in FIG. 3.

FIG. 6 shows the relationship of the grating marks RMa, WMa seen from the side of the reticle R, wherein a rectangular area ALx indicates the image of the aperture of the diaphragm 40. Said grating marks RMa, WMa are composed of 1:1 lines and spaces (duty ratio 50%), and the pitch GPr of the mark RMa on the reticle R and the pitch GPw of the mark WMa on the wafer W are correlated by GPr=M×GPw, wherein 1/M is the magnification of the projection lens PL. At the scanning exposure, the marks RMa and WMa move on the reticle plane, relative to the area ALx, in the same direction (+X direction in FIG. 6) with a same speed v. As shown in FIG. 6, the grating marks RMa and WMa are in advance displaced to maintain a predetermined gap DS therebetween when the alignment in the non-measuring direction (Y-direction in this case) is attained. Said gap DS is determined depending on the precision of alignment in the Y-direction.

Figure 7:
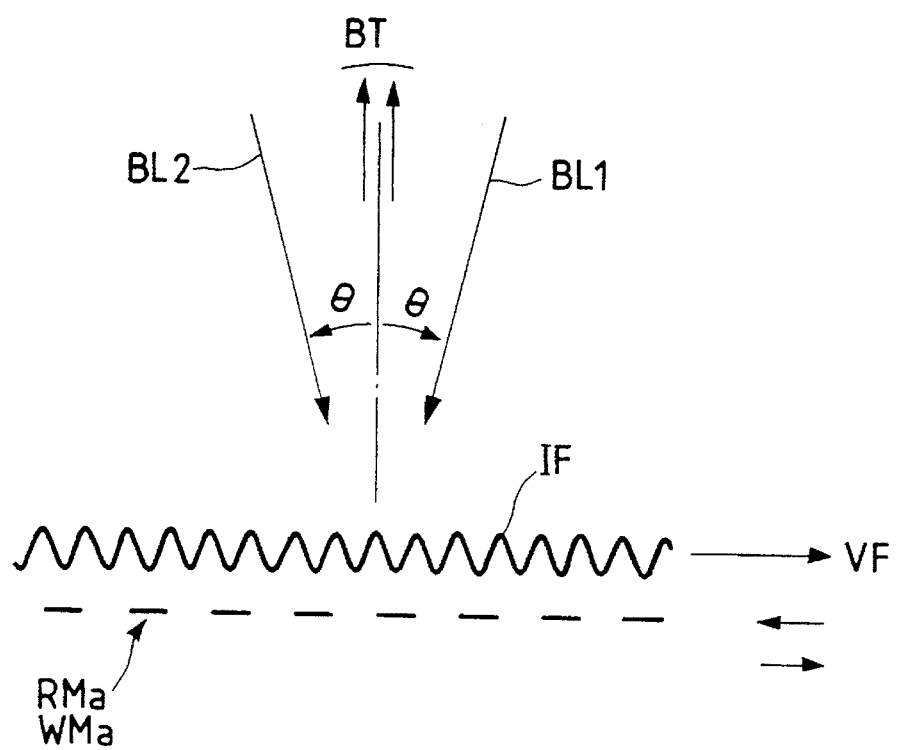
FIG. 7 is a view showing the working principle of the alignment system shown in FIG. 5.

FIG. 7 shows a state in which the grating mark RMa or WMa moves with a speed +v or −v in the direction of pitch, and the interference fringes IF formed on each grating mark flow with a speed +Vf. If the grating mark moves with a speed +v, namely in the same direction as the flowing direction of the interference fringes, the beat frequency of the interference light of ±1st-order diffracted lights perpendicularly generated from the grating mark becomes lower than Δf. On the other hand, when the grating mark moves with a speed −v, namely in the opposite direction to the flowing direction of the interference fringes 1F, the beat frequency becomes higher than Δf.

With respect to the grating mark RMa, the incident angle θ of two incident beams BL1, BL2 is determined, symmetrically with respect to the optical axis AXa, as follows:

$$\sin\theta = \lambda/GPr.$$

Under this condition, the ±1st-order diffracted lights are generated perpendicularly to the grating mark RMa. Also under this condition, the pitch Pif of the interference fringes 1F is determined by:

$$Pif = \frac{1}{2} \times GPr.$$

Therefore, based on the relation between the frequency difference Δf between the +beams BL1, BL2 and the speed v (mm/s) of the grating mark and on the Doppler effect, the frequency fs (kHz) of variation in intensity of the interference light BT is represented by fs=Δf+2 v/GPr as explained before.

The interference light BTr from the reticle grating mark RMa and the interference light BTw from the wafer grating mark WMa return along the optical axis AXa through the objective lens 23, ¼ wavelength plate 43 and polarizing beam splitter 42 as shown in FIG. 5, and enter a lens system 44, which functions as an inverse Fourrier conversion lens to form a plane conjugate with the grating mark RMa or WMa. The interference light beams BTr, BTw emerging from the lens system 44 are divided by a half mirror 45, and reach light shield plates 46R, 46W. Said light shield plate 46R is provided with an aperture APR, which is positioned conjugate with the grating mark RMa and transmits the interference light beam BTr from said mark RMa but intercepts the other interference light beam BTw. Similarly, the light shield plate 46W is provided with an aperture APW which is positioned conjugate with the grating mark WMa and transmits the interference light beam BTw from the mark WMa but intercepts the other beam BTr.

A photosensor (photodiode or photomultiplier) 47R receives the interference light beam BTr from the aperture APR and generates a signal SR, while a photosensor 47W receives the interference light beam BTw from the aperture APW and generates a signal SW.

These signals SR, SW are processed as already explained in relation to FIG. 3.

In the present embodiment, the wafer stage 9 is controlled with a constant speed during the scanning exposure, because a fluctuation in the scanning speed results in an uneven exposure within the shot area SA. Also the aperture in the blind 1 is not necessarily shaped as a slit but may also be shaped as a hexagon, a rectangle, an arc etc. contained in the circular image field of the projection lens PL.

A step-and-scan exposure apparatus employing a blind with a hexagonal aperture is disclosed in U.S. Pat. No. 4,924,257, and the alignment control system of the present embodiment may be incorporated in the above-mentioned apparatus.

In the following there will be explained a second embodiment of the present invention, which includes the first embodiment and also enables two-dimensional (X, Y) alignment during the scanning exposure.

The arrangement of the grating marks in the present embodiment on the reticle R and on the wafer W are so modified that the interference fringe alignment can be conducted also in the Y-direction perpendicular to the X-direction for scanning exposure. In the present embodiment, the alignment system of TTR method shown in FIGS. 3 and 5 are provided in two sets respectively for the X- and Y-directions, and grating marks for X- and Y-directions are provided on the street lines of the reticle and the wafer.

Figure 8:
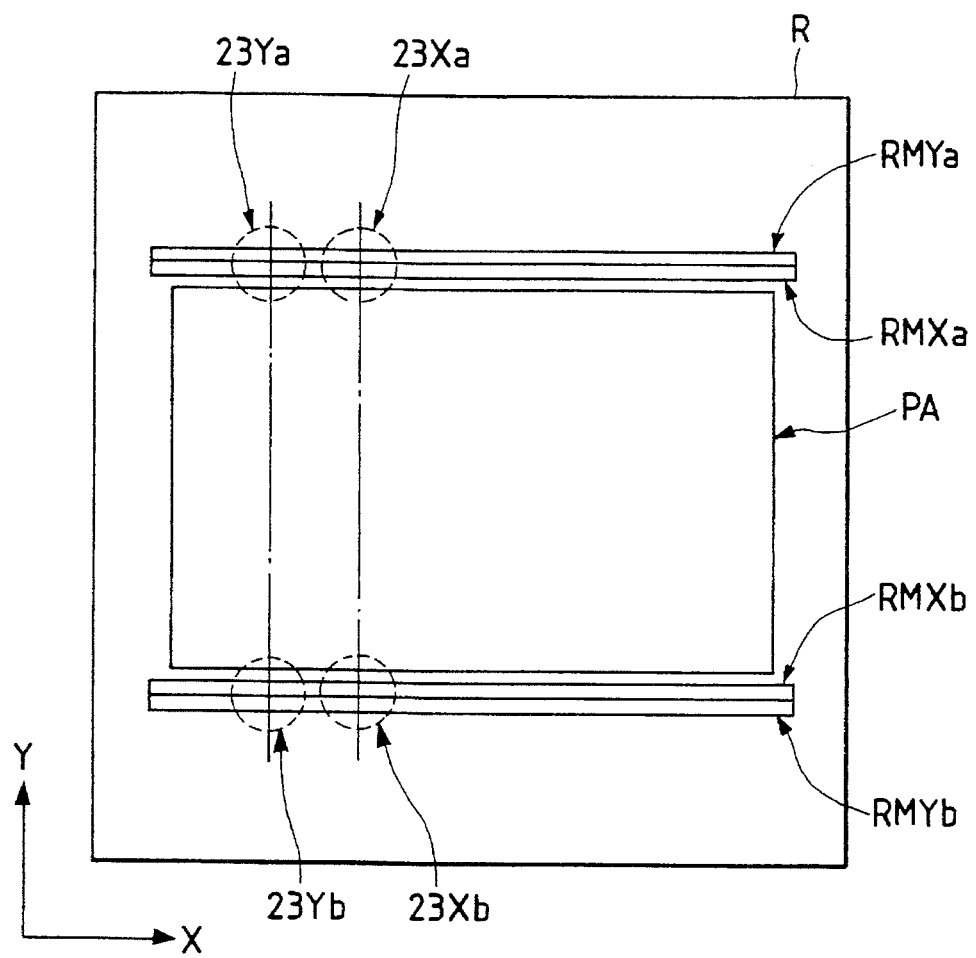
FIG. 8 is a top plan view of a reticle having a mark arrangement constituting a second embodiment.
Figure 9:
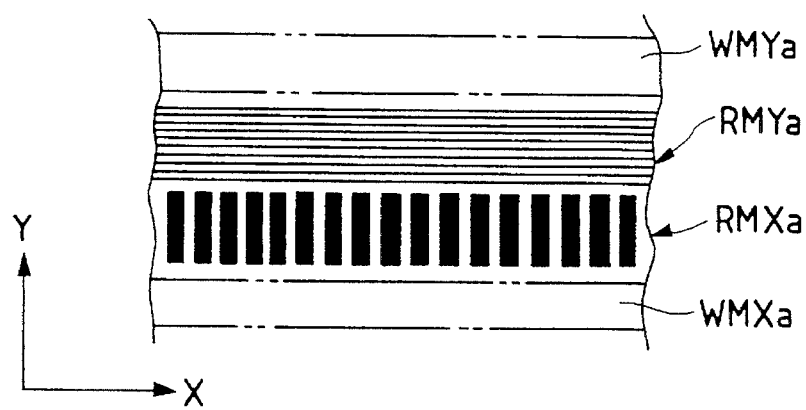
FIG. 9 is a magnified partial plan view of the mark shown in FIG. 8.

FIG. 8 shows the arrangement of marks on the reticle R and the arrangement of objective lenses of the alignment systems. The scanning exposure is conducted along the X-direction, and, in the street line areas in the X-direction on both sides of a pattern area PA of the reticle R, there are provided grating marks RMYa, RMYb for the Y-direction and grating marks RMXa, RMXb for the X-direction. These grating marks are constructed as shown in magnified manner in FIG. 9. The grating mark RMYa for the Y-direction consists of several line and space patterns extended in the X-direction, and the grating mark RMXa for the X-direction is positioned adjacent. On both sides of said grating marks RMYa and RMXa on the reticle R, there are formed transparent areas, in which the corresponding grating marks WMYa for the Y-direction and WMXa for the X-direction of the wafer W are positioned.

In this embodiment, among these grating marks, those RMXa (WMXa) and RMXb (WMXb) for the X-direction are detected through objective lenses 23Xa, 23Xb of the alignment systems for the X-direction, while grating marks RMYa (WMYa) and RMYb (WMYb) for the Y-direction are detected through objective lenses 23Ya, 23Yb of alignment systems for the Y-direction.

The alignment systems for the Y-direction are basically same as those for the X-direction, except that the incident angle of two beams BL1, BL2 to the reticle R (or wafer W) is inclined in the Y-Z plane. Aperture diaphragms 46R, 46W in the alignment systems for the X-direction are so designed as to intercept the interference light beams from the grating marks RMYa, WMYa (RMYb, WMYb) for the Y-direction, while apertures diaphragms in the alignment systems for the Y-direction are so designed as to intercept the interference light beams from the grating marks RMXa, WMXa (RMXb, WMXb).

When the reticle R and the wafer W are moved in the X-direction in a relative scanning motion, the frequency of two signals obtained by photoelectric detection of the interference (beat) light from the grating mark RMYa for the Y-direction on the reticle R and the interference (beat) light from the grating mark WMYa for the Y-direction on the wafer W becomes substantially constant (Δf) regardless of the scanning speed of the reticle R and the wafer W in the X-direction. Although said frequency is variable in case the alignment error in the Y-direction shows a steep change in time, but said variation is almost negligible, so that the alignment error in the Y-direction can be determined by simply detecting the phase difference of said two signals. Also for the Y-direction, said alignment error can be continuously obtained, and the reticle stage 6 or the wafer stage 9 is moved slightly in the Y-direction so that said error remains always constant. Otherwise, during the scanning exposure, servo (feedback) control may be applied to the drive system for the reticle stage 6 or the wafer stage 9 for the Y-direction, based on the alignment error signal in the Y-direction.

In the present embodiment, the alignment systems for the X- and Y-directions are positioned along the direction of scanning exposure, but four beams may be introduced into a single objective lens for effecting the alignments in the X- and Y-directions.

Though not illustrated in FIG. 3, an alignment system of TTR type is provided above the reticle R, in order to observe the grating marks on the reticle R and a reference mark on the wafer stage 9 under illuminating light of a wavelength same as that of the exposing light. Said alignment system is required for baseline management in case the beams BL1, BL2 of the alignment systems shown in FIGS. 3 and 5 have a wavelength different from that of the exposing light.

Figure 10:
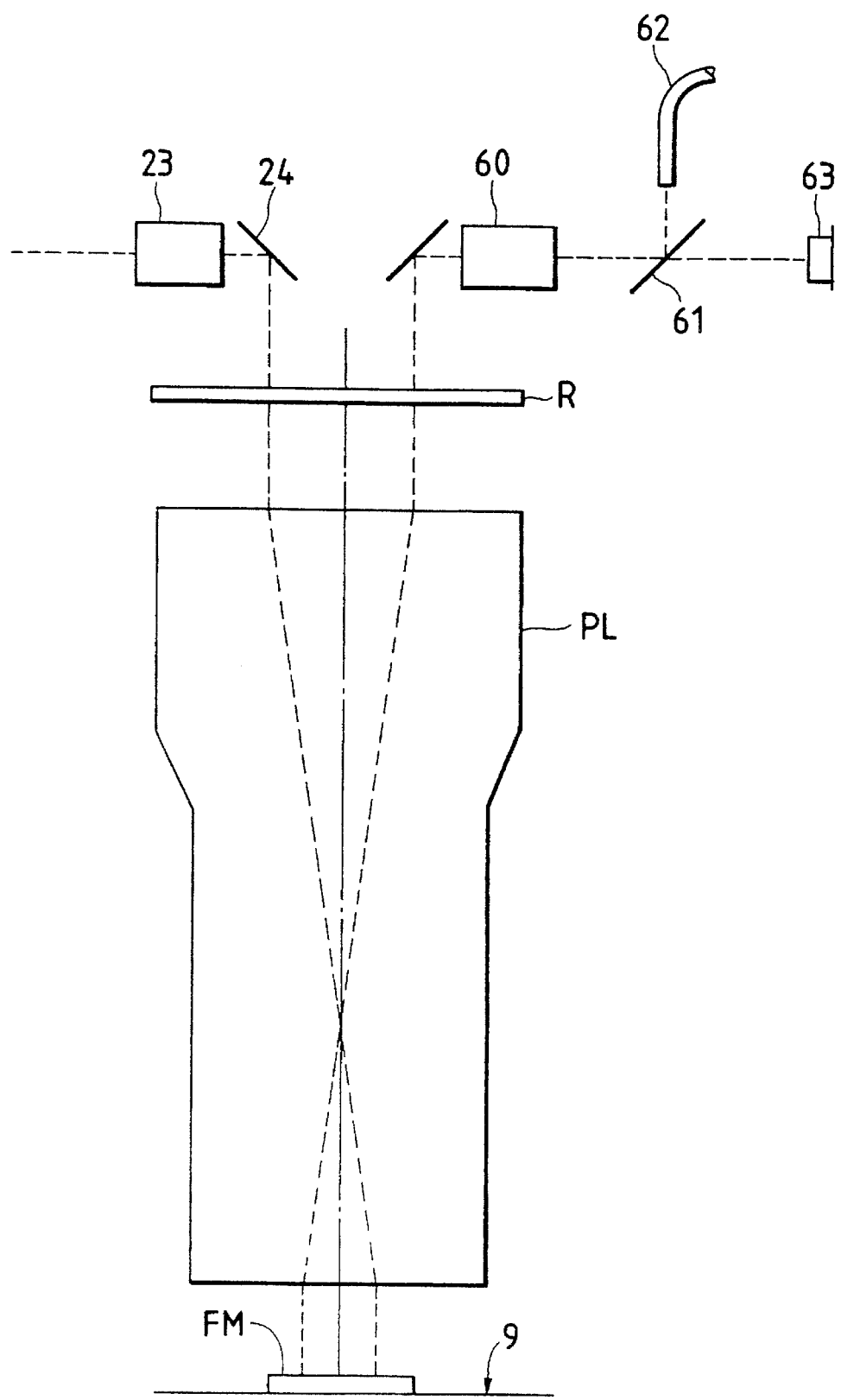
FIG. 10 is a view showing the principle of base line measurement.

Said TTR alignment system employing a wavelength same as that of the exposing light is constructed, for example, as shown in FIG. 10.

In FIG. 10, objective lenses 23, 24 are same as those shown in FIG. 3. In addition there is provided a TTR alignment system consisting of an optical fiber 62, a beam splitter 61, an objective lens 60, an image pickup device 63 etc., and, on the wafer stage 9 a reference mark plate FM is fixed. The optical fiber 62 emits illuminating light of a wavelength same as that of the exposing light, and the light reflected by the beam splitter 61 illuminates the grating mark on the reticle R through the objective lens 60. The light transmitted by the reticle R illuminates, through the projection lens PL, a grating mark on the reference mark plate FM. On said reference mark plate FM, a grating mark is provided in a position simultaneously detectable through the objective lens 23, as shown in FIG. 10.

The image pickup device 63 is used for taking the images of the grating mark on the reticle R and that on the reference mark plate FM, thereby determining the positional aberrations (ΔXe, ΔYe) of both marks. At the same time the interference fringe alignment system is activated through the objective lens 23, thereby determining the relative positional aberrations (ΔXa, ΔYa) between the grating mark of the reticle R and the grating mark of the reference mark plate FM.

Thus the baseline amount can be determined as (ΔXa–ΔXe, ΔYa–ΔYe).

In this operation, however, the wafer stage 9 (reference mark plate FM) has to be stopped, and, for this purpose, the wafer stage 9 is usually feedback controlled in such a manner that the measurement of a laser interferometer 11 remains constant. However, since the optical path of the laser interferometer 11 is open to the air, the measured value varies slightly even by slight air perturbation. Thus, in the above-mentioned baseline measurement, even if the wafer stage 9 is maintained standstill by the measurement of the laser interferometer 11, there still results a drift by the air movement.

On the other hand, the interference fringe alignment system shown in FIGS. 3 and 5 is almost free from the error in measurement resulting from such air movement, since the beam is only slightly exposed in the air between the reticle R and the projection lens PL, and between the projection lens PL and the wafer W.

Consequently, said interference fringe alignment system is used for feedback control of the reticle stage 6 or the wafer stage 9 so as to attain alignment between the reticle R and the reference mark plate FM. In this manner the relative positional aberration between the reticle R and the reference mark plate FM can be reduced to almost zero under the alignment system of different wavelength (objective lens 23). In this state the image pickup device 63 is used for determining the positional aberration between the grating mark of the reticle R and that of the reference mark plate FM, and thus determined aberration gives the baseline (ΔB, ΔYB). Said baseline is a specific value resulting from the chromatic aberration of the projection lens PL, and is checked whenever the detecting position of the grating mark on the reticle R (image height of the projection lens) is varied.

Said baseline amount (ΔXB, ΔYB) is added as an offset to the relative positional aberration of the reticle R and the wafer W, detected through the objective lens 23, and used as correction for the true overlaying position. Since the observing position through the objective lens 60 is displaced from the slit illuminating area of the exposing light on the reticle R, a specific error can result, in strict sense, from said displacement. Said error is based on the distortion of the projection lens PL at the exposing wavelength. However, since the distortions at different points within the projection field of the projection lens PL can be determined in advance, it is preferable to memorize the distortion at the observing position of the objective lens 60 as an offset amount specific to the apparatus and to correct the measured value of baseline with said offset amount.

Figure 11:
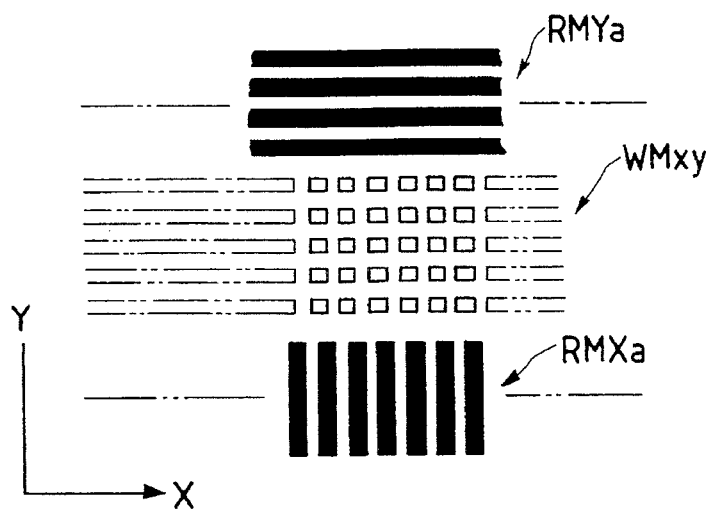
FIG. 11 is a view showing a mark arrangement constituting a third embodiment.

FIG. 11 shows the grating mark arrangement in a third embodiment of the present invention, wherein a two-dimensional grating is used as the grating mark formed in the street line of the wafer W, for space saving. On the reticle R, as shown in FIG. 11, a grating mark RMYa for the Y-direction and a grating mark RMXa for the X-direction are formed with a predetermined gap in the Y-direction, and a two-dimensional grating WMxy on the wafer W is positioned in said transparent gap. Said two-dimensional grating WMxy consists of small rectangular dot patterns arranged with predetermined pitches in the X- and Y-directions. In the actual alignment operation, the alignment system for the X-direction and that for the Y-direction are preferably separated in position, as shown in FIG. 8.

However, if two beams for X-alignment and two beams for Y-alignment are polarized in mutually complementary manner, the interference light beams perpendicularly generated from the two-dimensional grating WMxy can be separated by polarized states. It is therefore possible to irradiate the grating mark with four beams (two for X-direction and two for Y-direction) through a same objective lens 23.

Such two-dimensional grating WMxy, if provided over the scanning range along the shot area on the wafer, enables considerable space saving and two-dimensional alignment correction in the course of the scanning exposure.

The general street line area on the wafer has a width (Y-direction in FIG. 11) of about 70 μm. If the rectangular dot in the two dimensional grating WMxy is square with a size of 4 μm (namely a pitch of 8 μm), there can therefore be formed 8 dots in the Y-direction, thus providing a practically sufficient precision of measurement. The grating marks RMYa, RMXa on the reticle shown in FIG. 11 may also be constructed as a two-dimensional grating similar to that on the wafer.

Figure 12:
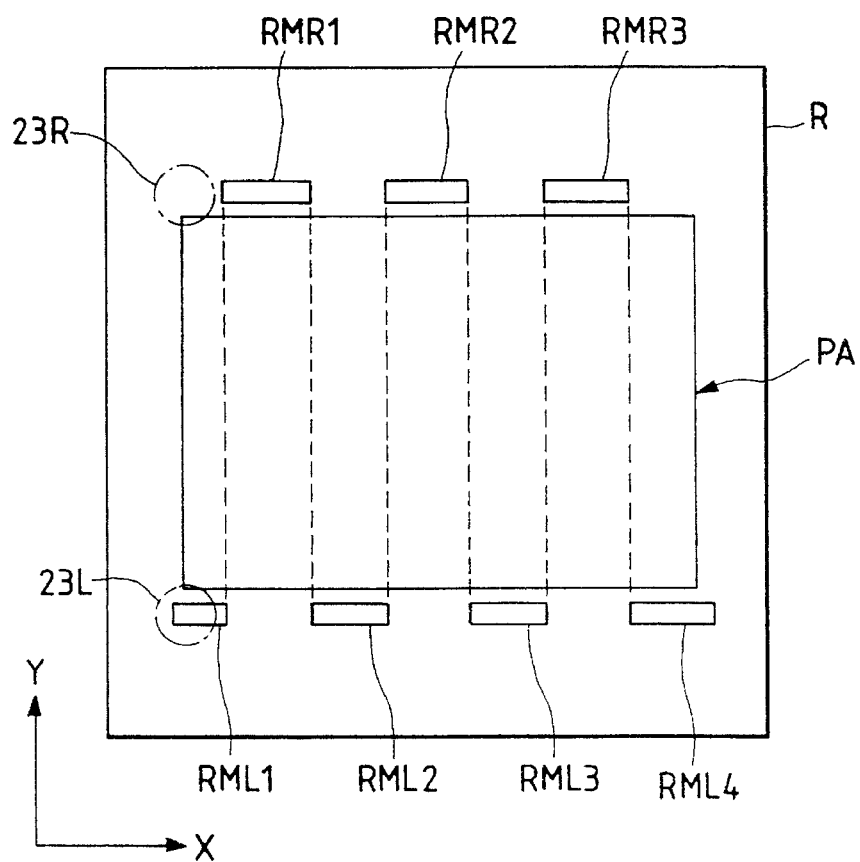
FIG. 12 is a view showing a mark arrangement constituting a fourth embodiment.

FIG. 12 shows the arrangement of grating marks in a fourth embodiment of the present invention, wherein one- or two-dimensional grating marks RML1–RML4, RMR1–RMR3 are formed intermittently, in the street line areas extending in the direction of scanning exposure outside the pattern area PA on the reticle R. Also on the wafer W, one- or two-dimensional grating marks are intermittently formed in the X-direction, corresponding to said grating marks on the reticle.

Said marks RML1–RML4 and marks RMR1–RMR3 are arranged in staggered fashion. Therefore, if two objective lenses 23R, 23L of the alignment systems are mutually spaced in the Y-direction, either of said objective lenses can always receive the interference light from the grating mark during the scanning exposure in the X-direction. For example, if the reticle R is moved laterally from the position shown in FIG. 12, alignment is attained between the grating mark RML1 and a corresponding grating mark on the wafer through the objective lens 23L, and, immediately before the illuminating area of two (or four) beams from the objective lens 23L goes out of the grating mark RML1, the grating mark RMR1 reaches the illuminating area of the incident beams from the objective lens 23R. In a next cycle, therefore, alignment is attained between the grating mark RMR1 and a corresponding grating mark on the wafer, through the objective lens 23R. Thereafter the alignment is conducted alternately by the objective lenses 23R, 23L, according to the scanning exposure signal. In the present embodiment, the marks are so arranged that, at the switching from the grating mark RML1 to the mark RMR1, the interference beat light obtained through the objective lens 23L and that obtained through the objective lens 23R co-exist for a short time.

In the mark arrangement of the present embodiment, another mark, for example a mark for wafer global alignment (EGA) can be formed in the space between the grating marks spaced in X-direction.

Figure 13:
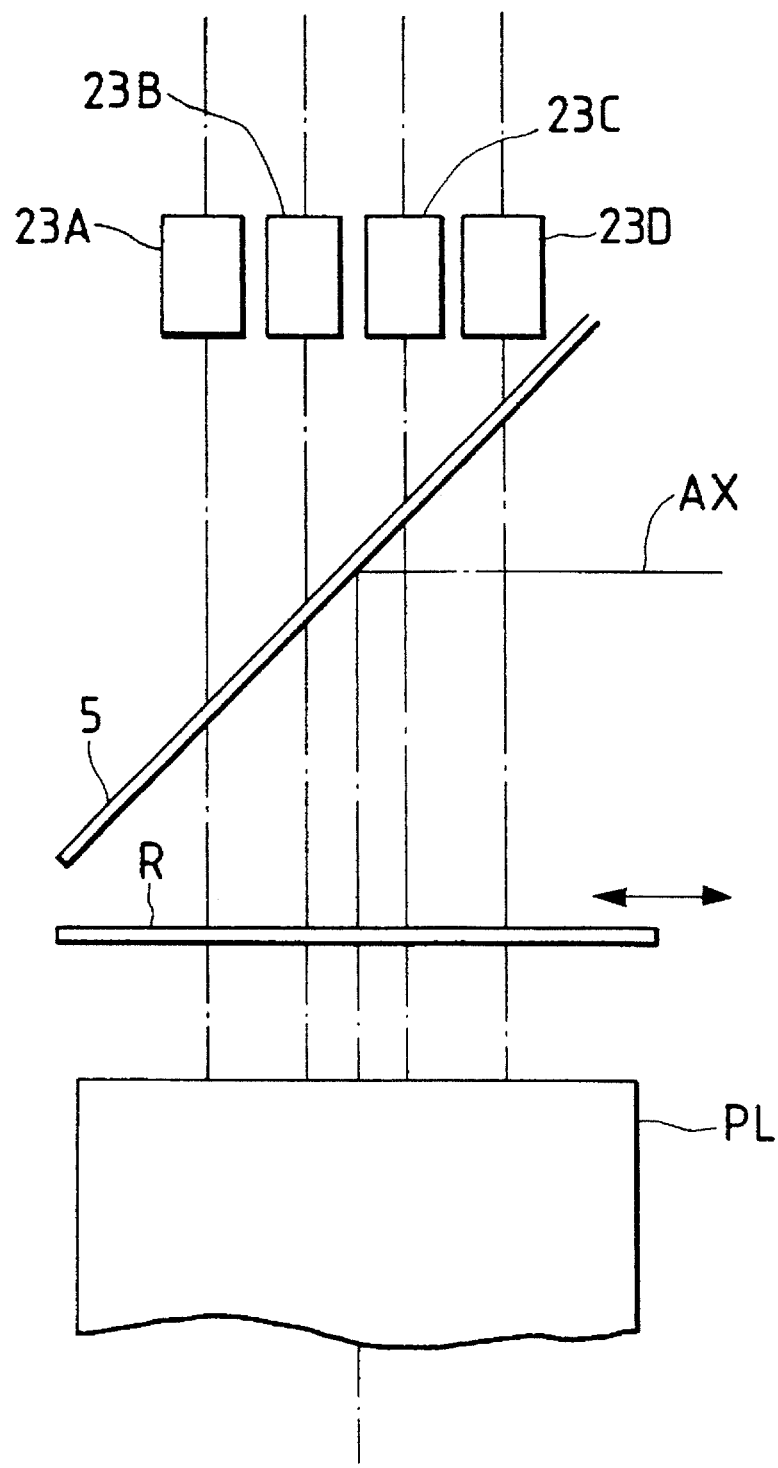
FIG. 13 is a view showing the structure of an apparatus constituting a fifth embodiment.

FIG. 13 shows the structure of a projection exposure apparatus constituting a fifth embodiment of the present invention. Different from the structure shown in FIG. 3, objective lenses 23A, 23B, 23C, 23D of plural alignment systems are arranged along the scanning direction of the reticle R (and of the wafer W). The grating marks on the reticle R and on the wafer W may be arranged as shown in FIG. 4, 8, 11 or 2.

In the structure shown in FIG. 13, four objective lenses 23A–23D respectively receive the interference beat light beams generated in different positions of the grating mark, thereby aligning the reticle R and the wafer W in the course of scanning motion, but only one of the end objective lenses 23A, 23D becomes usable in certain scanning positions.

Therefore, as an alignment sequence, in case the reticle R is scanned from left to right in FIG. 13, the number and position of the activated alignment system may be varied in the order of 23A, 23B, . . . , depending on the scanning position of the reticle R. Also if plural alignment system are simultaneously usable as shown in FIG. 13, the Signal for alignment can be obtained substantially continuously, even if the grating marks RML1–RML4 and RMR1–RMR3 shown in FIG. 12 are not arranged in staggered fashion.

For this purpose, the pitch of the objective lenses 23A–23D in the scanning direction (X-direction) is selected different from that of the grating marks RML1–RML4 in the X-direction.

In the following there will be explained a sixth embodiment with reference to FIG. 14, which shows an example of the structure of the two-beam frequency shifter section 21.

In the foregoing embodiments, the interference light from the grating mark to be photoelectrically detected is subjected to Dopler effect. For this reason there is employed a method of selecting a relatively low scanning speed v in order to maintain the frequency fs at a value ensuring the phase difference measurement, or a method of effecting the scanning exposure always in the +X direction only, avoiding the −X direction in which the frequency fs becomes lower. However, the throughput of the exposure apparatus has to be sacrificed in these methods.

In the present embodiment, therefore, the frequency difference Δf (equal to the beat frequency) of two incident beams is inverted in polarity, namely the frequencies of said two incident beams are mutually interchanged, according to the moving direction of the reticle R (or the wafer W), in order that the frequencies of the detection signals SR, SW are always higher than the beam frequency (namely the frequency difference Δf of two incident beams) regardless of the moving direction of the reticle R (or the wafer W).

Figure 14:
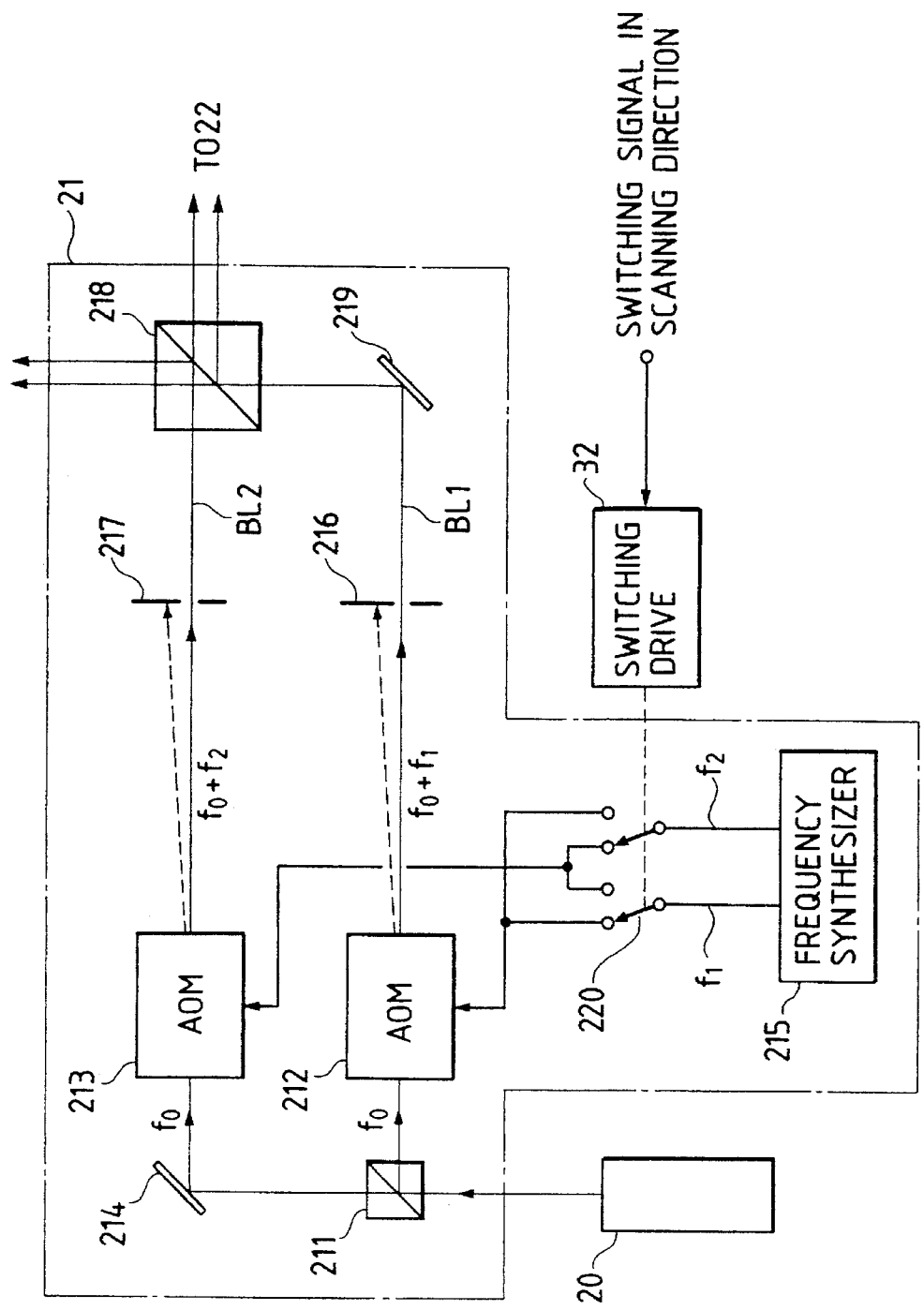
FIG. 14 is a view showing the detailed structure of a two-beam frequency shifter in a sixth embodiment.

Referring to FIG. 14, the two-beam frequency shifter 21 is provided with a beam splitter 211 for splitting the laser beam from the alignment laser unit 20; an acoustooptical modulator (AOM) 212 for receiving one of the laser beam split by said beam splitter 211; another acoustooptical modulator (AOM) 213 receiving, through a mirror 214, the other of the laser beam split by the beam splitter 211; and a frequency synthesizer 215 for generating high frequency signals of a frequency f1 and another frequency f2. The alignment light beams entering said AOM's 212, 213 are diffracted according to the high frequency signals supplied from the frequency synthesizer 215 to the AOM's 212, 213.

When the incident lights to the AOM's 212, 213 have a frequency f0 while the AOM's 212, 213 receive high frequency signals of frequencies f1, f2, the +1st order diffracted light emerging from the AOM 212 has a frequency of f0+f1 while the +1st order diffracted light emerging from the AOM 213 has a frequency of f0+ f2. At the exit side of the AOM's there are provided apertures 216, 217 for passing the +1st order diffracted lights only, whereby an alignment light beam BL2 passing through said aperture 217 is directly introduced into a beam splitter 218, while an alignment light beam BL1 passing through said aperture 216 is introduced, through a mirror 219, into said beam splitter 218. The crossing angle of two alignment light beams, on the mask grating and on the wafer grating, is defined by the distance of two alignment light beams BL1, BL2 emerging from said beam splitter 218.

A switch 220, provided between the frequency synthesizer 215 and the AOM's 212, 213, selectively supplies the high frequency signals of frequencies f1, f2 from the frequency synthesizer 215 respectively to said AOM's, whereby the frequency difference of the alignment light beams from said AOM's 212, 213 can be inverted in polarity, namely the frequencies of said alignment light beams can be mutually interchanged. Said switch 221 is shifted by a switching drive unit 32 positioned outside the two-beam frequency shifter 21. Said switching drive unit 32 receives a scanning direction switch signal for the reticle R (or the wafer W), and shifts the switch 220 according to said signal.

As an example, let us consider a situation in which the switch 220 is in a position shown in FIG. 14 when the reticle R is scanned in the positive X-direction (direction indicated by an arrow in FIG. 4). When the high frequency signals from the frequency synthesizer 215 has a relation f1>f2, the difference between the frequencies of the alignment lights from the AOM's 212, 213 is selected smaller than the frequencies of the above mentioned detection signals SR, SW. If the reticle scanning direction signal supplied to the switching drive unit 32 is switched to the negative direction, the switch 220 is shifted from the illustrated position, whereupon the AOM 212 receives the high frequency signal of the lower frequency while the AOM 213 receives that of the higher frequency. Consequently the frequency difference of the alignment light beams emerging from said AOM's becomes smaller than the frequencies of the detection signals SR, SW, as in the scanning in the positive direction.

By inverting the polarity of the frequency difference of the beams BL1, BL2 according to the scanning direction of the reticle R as explained above, the limitation in the scanning speed or in the scanning direction can be eliminated, so that the throughput of the apparatus can be improved.

In the foregoing embodiment, the frequencies of the beams BL1, BL2 are inverted according to the scanning direction of the reticle R (or the wafer W). It is also possible, however, to vary at least one of the frequencies of the beams BL1 and BL2 in such a manner that the frequencies of the detections signals SR, SW become always higher than the frequency difference Δf, according to at least one of the scanning speed and the scanning direction of the reticle R (or the wafer W).

Figure 15:
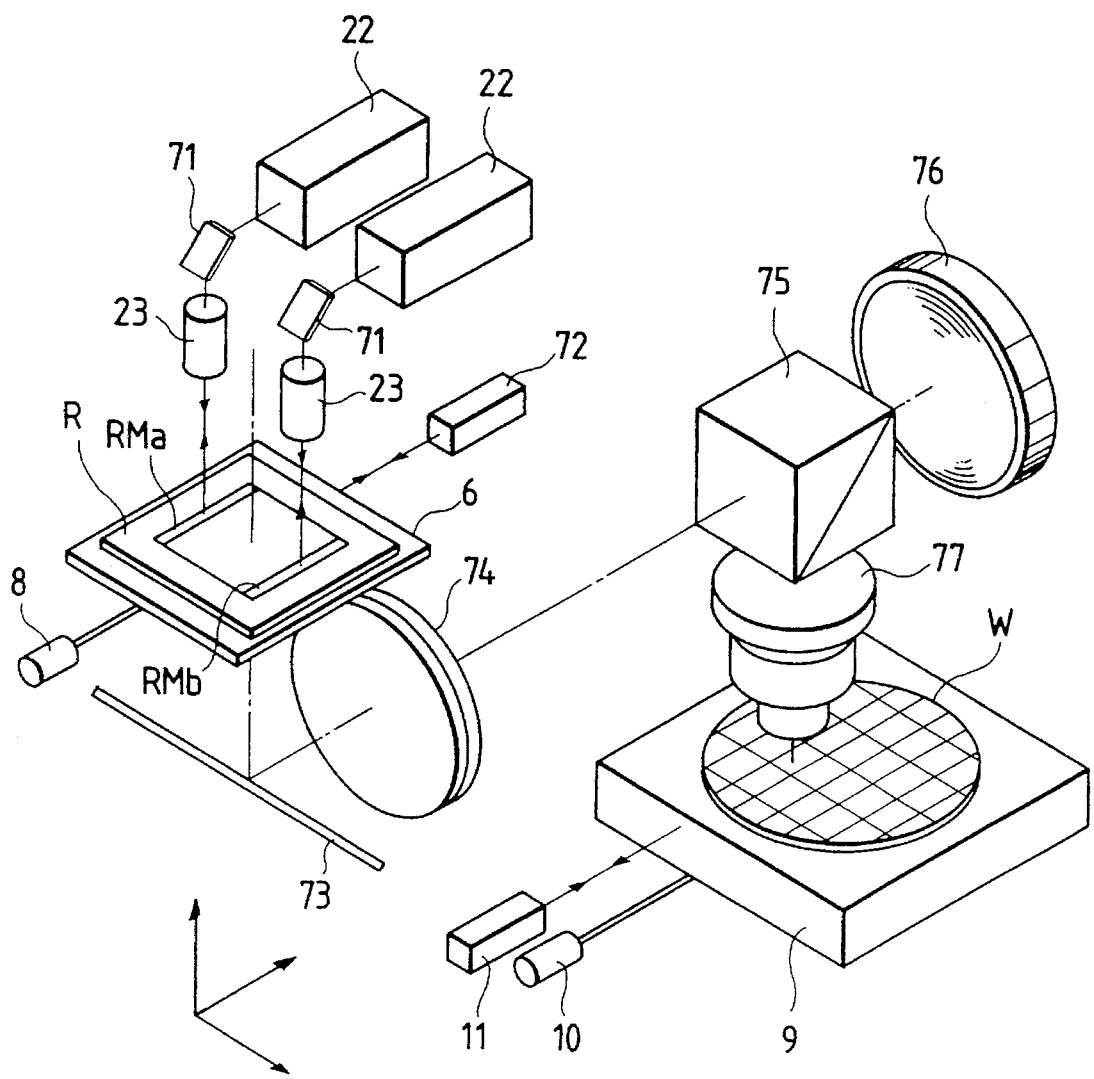
FIG. 15 is a perspective view of an exposure apparatus provided with a reflective refraction projection optical system, in which the present invention is applicable.

FIG. 15 is a perspective view of a reflective refraction exposure apparatus in which the scanning exposure apparatus of the present invention is applicable.

In FIG. 15, same components as those in FIG. 3 are represented by same symbols, and the different points alone will be briefly explained in the following. There are provided mirrors, 71, 73; an interferometer 72 for measuring the position of the reticle stage 6; a lens 74; a beam splitter 75; a concave mirror 76; and a refractive lens system 77. The alignment light emerging from the incident optical system 22 enters the reticle gratings RMa, RMb of the reticle R through the mirror 71 and objective lens 23, and also enters the wafer gratings WMa, WMb (not shown) of the wafer W, through the translucent part of the reticle R, mirror 73, lens 74, beam splitter 75, concave mirror 76 and refractive lens system 77. The method of interference light formation of the gratings and of processing of interference lights are same as those explained above in relation to the foregoing projection exposure apparatus.

In the foregoing there has been explained the alignment method utilizing interference fringes on the exposure apparatus, but the present invention is applicable also to an apparatus for forming a beat interference light by irradiating a diffraction grating with lights having a frequency different and measuring the position or speed of a moving object by means of said beat.

In such application there is employed the following configuration.

On an object effecting a reciprocating motion along a first direction, there is provided a diffraction grating consisting of plural grating elements arranged with a constant pitch along said first direction, and a portion of said diffraction grating is simultaneously irradiated by two coherent beams, symmetrically inclined in said first direction. An interference light, formed by two diffracted lights generated in a same direction from said diffraction grating, is detected by a photosensor, and the moving amount or moving position of said object is measured, according to an AC signal obtained from said photosensor. There are provided frequency modulation means for forming a predetermined frequency difference between the two beams irradiating said diffraction grating, and switch means for switching the polarity of the frequency difference of said two beams, according to the direction of reciprocating motion of the object, in such a manner that the frequency of the AC signal obtained in the photosensor is always higher than the frequency difference of the two beams, regardless of the direction of motion of the object.

Figure 16:
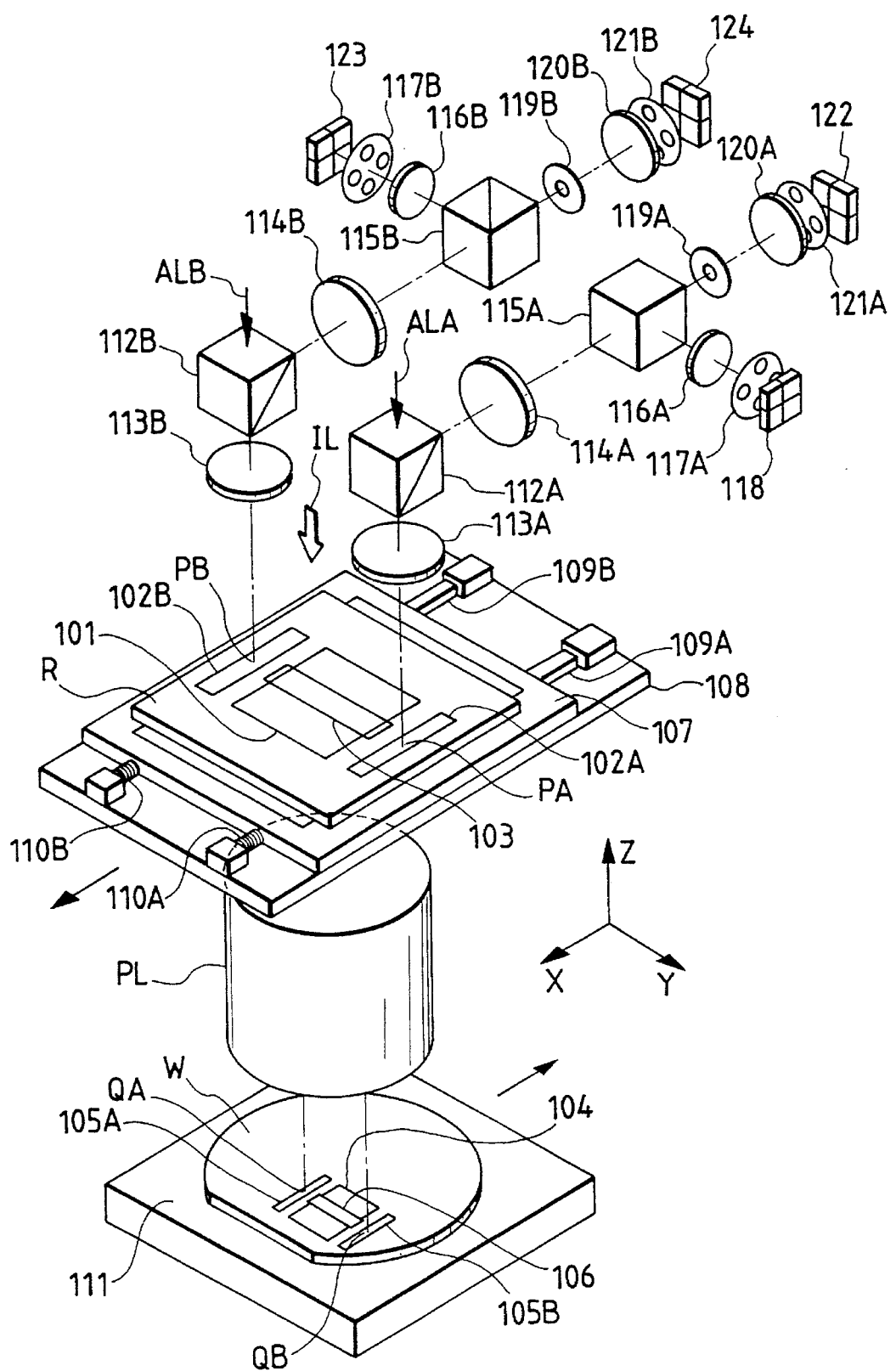
FIG. 16 is a schematic view illustrating the arrangement of a projection scanning exposure apparatus according to a seventh embodiment of the present invention.

Next, explanation will be made of a seventh embodiment of the present invention with reference to FIGS. 16 to 21. Referring to FIG. 16, a pattern 101 is formed at the lower surface of a reticle R, two dimensional (checkered grill-like) diffraction grating marks 102A, 102B are formed on opposite sides of the pattern 101 along the longitudinal direction (direction X) of the pattern 101 over the entire area thereof. Further, illumination light IL from an illumination optical system which is not shown is irradiated to a slit-like illumination area 103 on a reticle R with a substantially uniform illuminance thereover. The image of the pattern in the illumination area 103 on the reticle R is formed in a slit-like exposure field 106 in a shot area 104 on a wafer W by a projection optical system PL. Two-dimensional (checkered grill-like) diffraction grating marks 105A, 105B are formed on opposite sides of the shot area 104 along the direction X over the entire range thereof. The illumination area 103 and the exposure field 106 have rectangular shapes in the direction Y. The illumination area 103 is scanned in the direction +X with the reticle R, and the exposure field 106 is scanned in the direction −X with the wafer W so that the image of the pattern 101 on the reticle R is projected to the shot area 104 on the wafer W and is exposed. Accordingly, the scanning direction of the reticle R and the waver W is the direction X in this embodiment.

Further, the reticle R is held on a slightly movable stage 107 which is set on a scanning stage 108. Although it is not shown, the scanning stage 108 is set on a base so as to be movable in the direction X. The slightly movable stage 107 is supported between two actuators (piezoelectric elements or the like) 109A, 109B and between compression springs 110A, 110B, which are provided on the scanning stage 108. The two actuators 109A, 109B are individually extended and retracted so as to enable the slightly movable stage 107 to move in the direction X, relative to the scanning stage 108, and to slightly rotate. In the present invention, the position of the reticle R during scanning exposure is microadjusted with the use of the slightly movable stage 107. A movable reflector in a laser interferometer, which is not shown, is fixed to the scanning stage 108, and accordingly, the coordinates of the scanning stage 108 in the direction X is always measured by the interferometer. Meanwhile, the wafer W is held on a wafer stage 111 which is composed of an XY stage for positioning the wafer in an XY plane and for scanning in the direction X, a Z stage for positioning the wafer W in a direction Z perpendicular to the XY plane, that is, a direction parallel to the optical axis of the projection optical system PL, a rotary table for slightly rotating the wafer W in the XY plane, and the like. The XY coordinates of the wafer stage 11 are also always monitored by the laser interferometer.

Figure 17A:
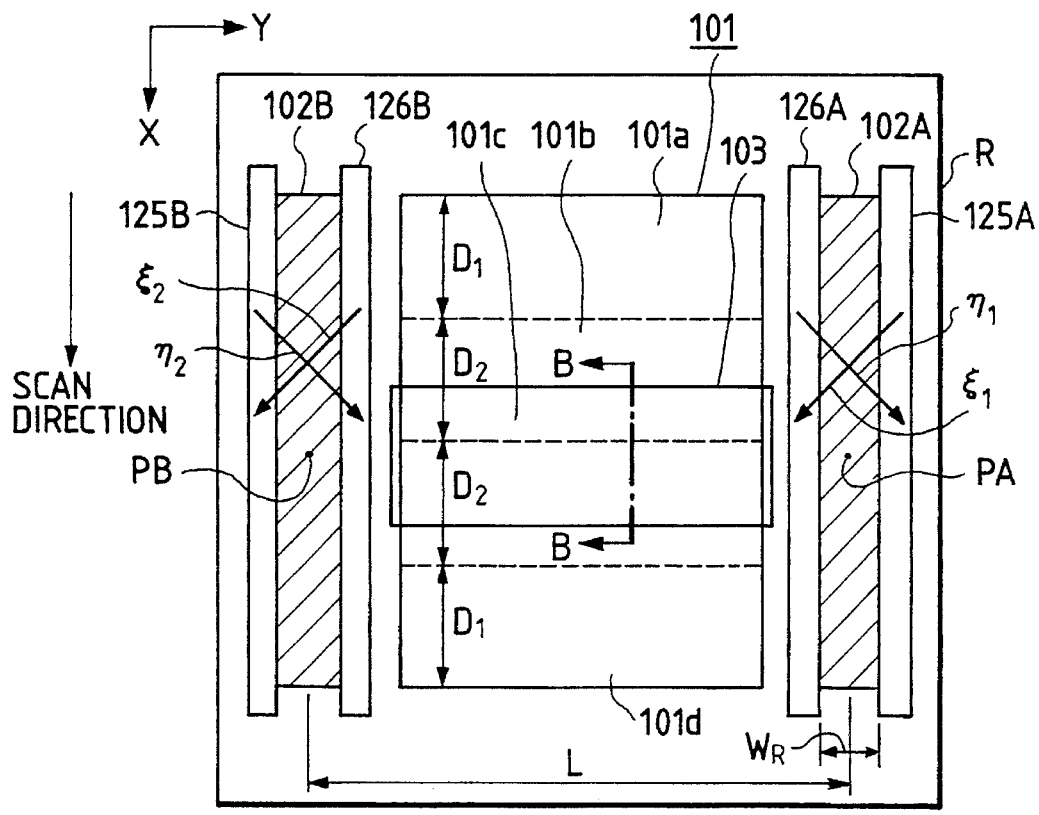
FIG. 17A is a view illustrating an arrangement of a reticle shown in FIG. 16.

Referring to FIG. 17A which shows the reticle R in the present invention, diffraction grating marks 102A, 102B are formed on the pattern 101 over the entire range thereof in the direction X. Further, light transmissible windows 125A, 126A are formed on opposite sides of the diffraction grating mark 102B. Similarly, light transmissible windows 125B, 126B are formed on opposite sides of the diffraction grating mark 102B. The diffraction grating marks 102A is a grill pattern which is formed along a $\xi_1$-axis and a $\eta_1$-axis crossing the X-axis at an angle of 45°, and the diffraction grating mark 102B is also grill pattern which are formed along $\xi_2$-axis and $\eta_2$-axis crossing the X-axis at an angle of 45°.

Figure 17B:
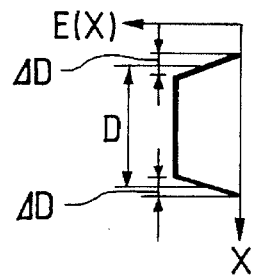
FIG. 17B is a view illustrating a distribution of illumination in a scanning direction with an illumination area on the reticle shown in FIG. 17A.

In this embodiment, the distribution E(X) of illuminance over the illumination area 103 in the scanning direction (direction X) on the reticle R is trapezoidal as shown in FIG. 17B in which reference numeral D denotes the half-value width of the distribution of illuminance, and ΔD denotes the widths of inclined parts at opposite ends of the distribution of illuminance. In this arrangement, as shown in FIG. 17A, the pattern 101 is divided into four partial patterns 101a to 101d which are arranged in the direction X, the width $D_1$ of opposite end partial patterns 101a, 101d in the direction X is set to (D-ΔD/2), and the width $D_2$ of intermediate partial patterns 101b, 101c is set to D.

Figure 18:
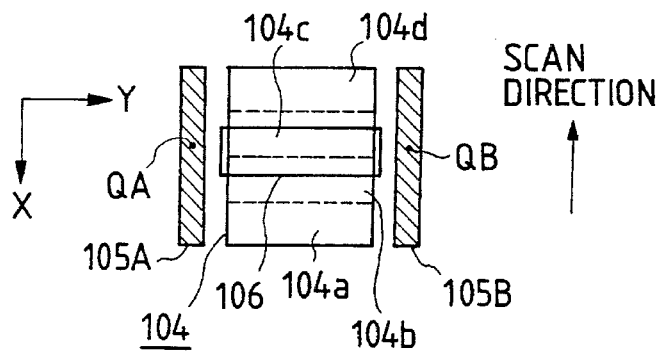
FIG. 18 is an arrangement of one of shot areas on a wafer shown in FIG. 16.

Referring to FIG. 18 which is an enlarged view illustrating the shot area 104 on the wafer W shown in FIG. 16, the shot area 104 is divided into partial exposure areas 104a to 104d which are arranged in the direction X. In this embodiment, the partial patterns 101a to 101d are projected individually onto the respective partial exposure areas 104a to 104d on the shot area 104 shown in FIG. 18. It is noted here that it is required to positionally align the reticle R and the wafer W with the use of an alignment system in order to the pattern on the reticle R is transferred onto the shot area. The explanation will be herein made of the alignment system.

Referring again to FIG. 16, a first alignment system is arranged above the diffraction grating mark 102A on the reticle R. In this alignment system, alignment light ALA consisting of eight laser beams from a light transmitting system which is not shown, is incident upon a transmitting and receiving separation prism 112A, and the alignment light ALA having passed through the separation prism 112A is projected onto the diffraction grating mark 102A and the windows 125A, 126A on both sides of the diffraction grating mark 102A. Of the alignment light ALA, four laser beams are projected crossing at a point PA on the diffraction grating mark 102A, and the other four laser beams are projected crossing a point QA in the diffraction grating mark 105A on the wafer W through the projection optical system PL.

Four groups of interference light (signal light from the wafer mark) between zero-order diffracted light and first-order light is transmitted to the windows 125A, 126A on the reticle R through the intermediary of the projection optical system. The four groups of interference light passing through the windows 125A, 126A, and four groups of interference light (signal light from the reticle mark) between zero-order diffracted light and first-order diffracted light, generated from the diffraction grating mark 102A on the reticle R pass through an objective lens 113A and is reflected by the transmitting and receiving separation prism 112A, and are thereafter focused by an objective lens 114A in a receiving optical system so that they are incident upon a separation prism 115A in the receiving optical system. It is noted here that the four groups of interference light from the point PA on the reticle R are reflected by the separation prism 115A in the receiving optical system, and is incident upon a photoelectric detector 118 after being passed through a lens 116 and a spacial filter 117A which is formed therein with four openings. Further, the photoelectric detector 118 is composed of four light receiving elements corresponding to the four openings, and accordingly, the four groups of interference light from the point PA are photo-electrically converted by the four light receiving elements, respectively. Meanwhile, four groups of interference light from the point QA on the wafer W are transmitted though the separation prism 115A and is then transmitted through a center opening in a spacial filter 119A, and thereafter, they are incident upon a photoelectric detector 122 through a lens 120A and a spacial filter 121A which is also formed with four openings. The photoelectric detector 122 is composed of four right receiving elements corresponding to these four openings. Accordingly, the four groups of interference light from the point QA on the wafer W are photoelectrically converted by the four light receiving elements in the photoelectric detector 122, respectively.

Further, a second alignment system is arranged above the diffracting grating mark 102B on the reticle R, which has an arrangement same as that of the first alignment system, and accordingly, simple explanation thereto will be hereinbelow made. The second alignment system is composed of a right transmitting system, components consisting of a transmitting and receiving prism 112B to a spacial filter 117B, a photoelectric detector 123, components consisting of a spacial filter 119B to a spacial filter 121B, and a photoelectric detector 124, which are arrangement symmetric with those in the first alignment system. Further, of alignment light ALB from the light transmitting system which is not shown, four laser beams are irradiated onto a point PB on the diffraction grating mark 102B of the reticle R, and the remaining four laser beams are irradiated onto a point QB on the diffraction grating mark 105B of the wafer W. Further, four groups of interference light from the point PB are photoelectrically converted by four light emitting elements of the photoelectric detector 123, respectively, and four groups of interference light from the point QB are photoelectrically converted by four light emitting elements of the photoelectric detector 124, respectively.

Next, explanation will be made of the detailed arrangement of the alignment system according to the present invention with reference to FIG. 19 which shows an optical system and a signal processing system in the first alignment system shown in FIG. 16. He—Ne laser light source or the like emitting coherent light to which a photoresist on the wafer W is insensitive, is used as an alignment light source 136 shown in FIG. 19.

Figure 19:
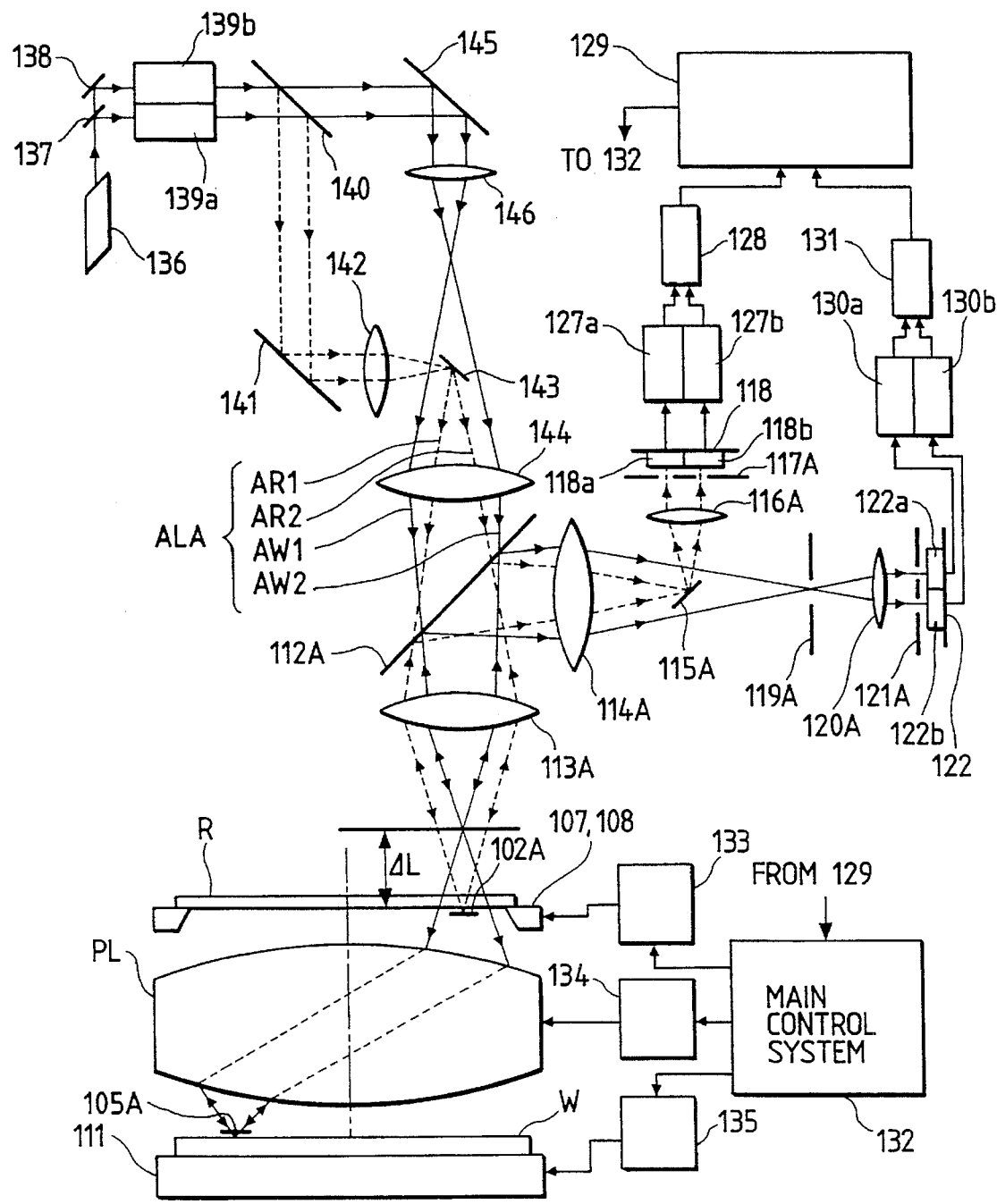
FIG. 19 is a view illustrating specific arrangements of first alignment system and a stage control system shown in FIG. 6.
Figure 20:
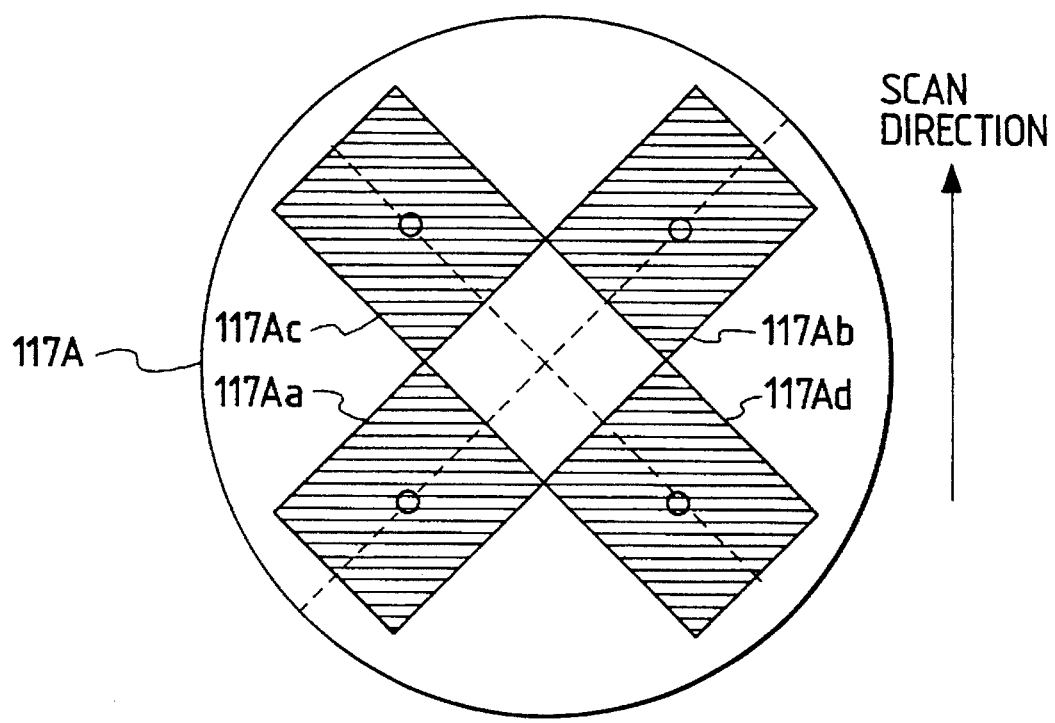
FIG. 20 is a view illustrating a configuration of a spacial filter in the alignment system shown in FIG. 16.

Referring to FIG. 19, a laser beam emitted from the light source 136, is split into two laser beams by a beam splitter 137 and a mirror 138, and the two laser beams are incident upon acoustooptic modulators (which will be simply denoted "AOM") 139a, 139b, respectively. The AOMs 139a, 139b are driven in accordance with drive signals having different frequencies, and the laser beams modulated in accordance with frequencies of the drive signals having different frequencies, respectively, by the AOMs 139a, 139b are incident upon a separation prism 140 in the light transmitting system. Two reticle detecting beams AR1, AR2 reflected by the separation prism 14 in the light transmitting system, are reflected by a mirror 141, and are then incident upon a beam synthesizing prism 143 in the light transmitting system through the intermediary of a relay lens 142. Meanwhile, two wave detecting beams AW1, AW2 having passed through the separation prism 140 in the light transmitting system are reflected by a mirror 145 and are then incident upon the beam synthesizing prism 143 in the light transmission system through the intermediary of a relay lens 146. Alignment light ALA consisting of four laser beams (AR1, AR2, AW1, AW2) and synthesized by the beam synthesizing prism 143 in the light transmitting system is incident upon the transmitting and receiving separation prism 112A by way of an objective lens 144 in the light transmitting system.

Further, the two laser beams AR1, AR2 are irradiated onto the diffraction grating mark 102A on the reticle R with a predetermined crossing angle, by way of the objective lens 113A. Specifically, the two laser beams AR1, AR2 are irradiated onto the diffraction grating mark 102A, symmetric with each other, along the $\eta_1$ axis shown in FIG. 17A. Further, the crossing angle of the two laser beams AR1, AR2 is set to be equal to the diffraction angle of the first-order diffracted light given by the diffraction grating mark 102A. Accordingly, the first-order diffracted light of the laser beam AR1 is generated in a direction same as that of the zero-order diffracted light, and the interference light thereof is received by the light receiving element 118b by way of the objective lens 113A, the transmitting and receiving separation prism 112A, the objective lens 114A, the separation prism 115A in the light receiving system, the lens 116A, and the spacial filter 117A. At this time, the image of the diffraction grating mark 102A is formed on the separation prism 115A by the objective lens 113A and the objective lens 114A in the light receiving system. The pupil surface (Fourier transform surface) of the objective lens 113A is substantially conjugate with the spacial filter 117A by means of the objective lens 114A in the light transmitting system and the lens 116A. Similarly, the first-order diffracted light beam AR1 of the laser beam AR2 is generated in a direction same as that of the zero-order diffracted light of the laser beam AR1, and the interference light thereof is received by the light receiving element 118a.

The photoelectric signals from the light receiving elements 118a, 118b are beat signals (which will be hereinbelow denoted "reticle signal") each having frequency $(\Delta f_1 \pm V\xi_1/P\xi_1)$ where $P\xi_1$ is pitches of the diffraction grating mark 102A in the $\xi_1$ axial direction, and $V\xi_R$ is an component of a scanning speed $V_R$ of the reticle R in the $\xi_1$ axial direction. Further, since these two signals changes their phases in dependence upon variations in the coordinate value of the point PA on the $\xi_1$ by scanning in the direction X with the reticle R, the value of the point PA on the $\xi_1$ axis can be obtained by detecting the phases of the two reticle signals. Referring to FIG. 19, the reticle signals from the light receiving elements 118a, 118b are delivered to phase detectors 127a, 127b, respectively, phase data detected by the phase detectors 127a, 127b are fed to a phase computer 128. The phase computer 128 performs an averaging process or the like with the phase data for the two reticle signals so as to obtain the phase of the point PA on the $\xi_1$ axis, and delivers these phase data as a reticle position signal to a position detecting signal processing system 129.

Meanwhile, the two wave detecting beams AW1, AW2 from the light transmitting system are transmitted through the objective lens 113A so as to cross together, and thereafter, they are irradiated onto the diffraction grating mark 105A on the wafer W through the windows 125A, 126A on the reticle R and the projection optical system PL with a predetermined crossing angle. In general, the projection optical system PL is subjected to correction for aberration to the exposure light IL such as the i-ray or the like, no correction for aberration to the alignment light such as He—Ne laser light or the like is not specifically carried out. Accordingly, a conjugated image on the outer surface of the wafer W is not formed on the pattern surface of the reticle R by the alignment light due to chromatic aberration of the projection optical system PL, but is formed being shifted by $\Delta L$ upward from the reticle R. Accordingly, two beams AW1, AW2 emitted from the objective lens 113 cross together above the reticle R by $\Delta L$.

That is, the laser beams AW1, AW2 for detecting the diffraction grating mark 105A on the wafer W, are incident upon the projection optical system PL through the windows 125A, 126A on the reticle R, after crossing at a conjugate point with respect to the wafer, and then cross together at the point QA on the diffraction grating mark 105A. At this time, the crossing angle of the two laser beams AW1, AW2 is set to be equal to the diffraction angle of the first-order diffracted light by the diffraction grating mark 105A. Further, the angular magnification $\gamma$ of the projection optical system PL for the reticle R on the wafer W with the alignment light, and the value $\Delta L$ with of chromatic aberration with the alignment light in the projection optical system PL have to satisfy the following relationship:

$$\Delta L (\sin \theta_w/\gamma) \cdot \sin 45° > W_R \quad (1)$$

where $W_R$ is the width of the diffraction grating mark 102A in the direction Y on the reticle R as shown in FIG. 17A, and $\theta_w$ is the crossing angle between the two laser beams AW1, AW2 on the wafer W, as shown in FIG. 19.

In this expression (1), the reason why "sin 45°" is used, is that the $\xi_1$ axis and the X cross together by an angle of 45°. Further, the width of the windows 125A, 126A has to have a size which enables the wave detecting beams to pass therethrough by a greater part. As a result, the interference light between the first-order diffracted light of the laser beam AW1 and the zero-order diffracted beam of the laser beam AW2 is received by the light receiving element 122a by way of the objective lens 113A, the beam splitter 112A, and objective lens 114A in the light receiving system, and the separation prism 115a in the transmitting and receiving separation prism 115A, the spacial filter 119A, the lens 120A and the spacial filter 121A. At this time, an image of the diffraction grating mark 105A on the wafer W is formed on the spacial filter 119A by the objective lens 113A and the objective lens 114A in the light receiving system. The pupil surface (Fourier transform surface) of the objective lens 113A is conjugate with the spacial filter 121A by the objective lens 114A in the light receiving system. Similarly, the interference light between the first order diffracted light of the laser beam AW2 and the zero-order diffracted light of the laser beam AW1 is received by the light receiving element 122b.

It is noted that the pitches of the diffraction grating mark 105A in an axial direction conjugate with the $\xi_1$ axis are $\beta \times P\xi_1$ and the component of the scanning speed $V_w$ in an axial direction conjugate with the $\xi_1$ axis is $\beta \times V\xi_R$, where $\beta$ is the projecting magnification of the projection optical system PL, and the photoelectric conversion signals from the light receiving elements 122a, 122b becomes beat signals (which well be hereinbelow denoted "wafer signal") having a frequency of $(\Delta f_1 \pm V\xi_1/P\xi_1)$. Further, when the scanning with the wafer W is carried out in the −X direction, these two wafer signals change their phases in dependance upon variations in the coordinate value of the point PA on an axis conjugate with the $\xi_1$ axis. Accordingly, the value of the point QA on an axis conjugate with the $\xi_1$ axis can be obtained by detecting the phases of the two wafer signals. Referring to FIG. 19, the wafer signals from the light receiving elements 122a, 122b are delivered respectively to the phase detectors 130a, 130b, and phase data detected by the phase detectors 130a, 130b are delivered to the phase computer 131. The phase computer 131 performs an averaging process or the like, so as to obtain the phase of the point QA shown in FIG. 18 on an axis conjugate with the $\xi_1$ axis, and the phase data is processed, and thus obtained phase data are fed as a wafer signal to the position detecting signal processing system 129. The position detecting signal processing system carries out computation of a difference in accordance with a reticle position signal from the phase computer 128 and a wafer position signal from the phase computer 131, thereby it is possible to obtain a relative positional deviation $\Delta\xi_1$ (a value converted onto the reticle R) between the reticle R and the wafer W in the $\xi_1$ axial direction.

This relative positional deviation $\Delta\xi_1$ is then delivered to the main control system 132 for controlling the apparatus in its entirety.

It is noted that the pitches $P\xi_1$ of the diffraction grating mark 102A on the reticle R on the $\xi_1$ axis is set so that the relative positional deviation $\Delta\xi_1$ between the reticle R and the wafer W falls in a range such as $\Delta\xi_{10}\pm P\xi_1/2$ where $\Delta\xi_{10}$ is the initial value of the relative positional deviation $\Delta\xi_1$ between the reticle R and the wafer W in the $\xi_1$ axial direction, even though the control is carried out in accordance with a result of measurement by the laser interferometer as is conventionally carried out.

Further, when the scanning is made with the precise positional relationship between the reticle R and the wafer, the beat frequency of the reticle signal is equal to that of the wafer signal, and variations in beat frequency, due to the scanning with the reticle R and the wafer W, are equal to each other. Accordingly, the relative positional deviation $\Delta\xi_1$ is maintained at its initial value $\Delta\xi_1$. Accordingly, the allowable range in the main control system 132 is set to be within a range around the initial value $\Delta\xi_{10}$ as a center.

Actually, referring to FIG. 17A, two reticle detecting beam are irradiated on the diffraction grating mark 102A on the reticle R in a direction along the $\eta_1$ axis, and two group of interference light consisting of the zero-order diffracted light and the first-order diffracted light obtained from these reticle detecting beams are received by two light receiving elements on the photoelectric detector 118 by way of openings 117Ac, 117Ad in the spacial filter 117A. Further, two wafer beams are irradiated onto the diffraction grating mark 105A even on the wafer W, along an axis conjugate with the $\xi_1$ axis, and two groups of interference light consisting of the zero-order diffracted light and the first-order diffracted light are received by the remaining two light receiving elements on the photoelectric detector 122 by way of two openings in the spacial filter 121A as shown in FIG. 19. Further, the reticle signals from the two light receiving elements on the photoelectric detector 118 and wafer signals from the two light receiving elements on the photoelectric detector 122 are processed so as to obtain the relative positional deviation $\Delta\eta_1$ between the point PA on the reticle R and the point QB on the wafer W in the $\eta_1$ axial direction. This relative positional deviation $\Delta\eta_1$ is delivered to the main control system 129 shown in FIG. 19.

Further, as shown in FIG. 17A, a pair of reticle detecting beams are irradiated onto the point PB on the diffraction grating mark 102B of the reticle R, along the $\xi_2$ axis and the $\eta_2$ axis, respectively, and, as shown in FIG. 18, a pair of wafer detecting beams are irradiated onto the point QB on the diffraction grating mark 105B of the wafer W, along the axes conjugate with the $\xi_2$ axis and the $\eta_2$ axis, respectively. Further, relative positional deviations $\Delta\xi_2$, $\Delta\eta_2$ between the point PB on the reticle R and the point QB on the wafer W along the $\xi_2$ axis and the $\eta_2$ axis, respectively, are detected, and are also delivered to the main control system 132.

Figure 21:
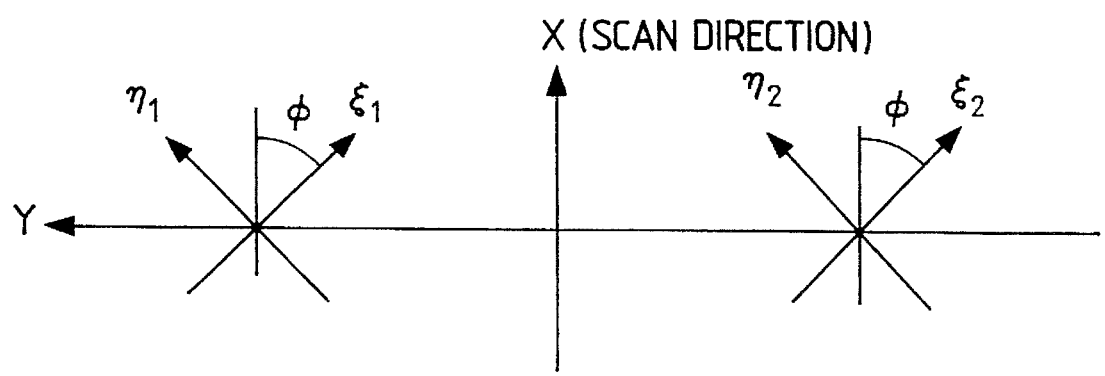
FIG. 21 is a view illustrating a relationship between the position detecting direction and the scanning exposure direction of the alignment system shown in FIG. 16.

The main control system 132 obtain a positional deviation $\Delta x$ in the scanning direction (the direction X) and a positional deviation $\Delta y$ in the nonscanning direction (the direction Y), between the reticle R and the wafer W, a relative rotating angle $\Delta\theta$ between the reticle R and the wafer W and an error $\Delta\beta$ in the magnification of projection from the reticle R to the wafer W are obtained from the relative position deviations $\Delta\xi_1$, $\Delta\eta_1$, $\Delta\xi_2$, $\Delta\eta_2$ between the reticle R and the wafer W along the four axes with the use of the following expressions:

$$\Delta x = \cos\phi\{(\Delta\xi_1+\Delta\eta_1)+(\Delta\xi_2+\Delta\eta_2)\}/2 \qquad (2)$$

$$\Delta y = \sin\phi\{(\Delta\xi_1-\Delta\eta_1)+(\Delta\xi_2-\Delta\eta_2)\}/2 \qquad (3)$$

$$\Delta\theta = \cos\phi\{(\Delta\xi_1+\Delta\eta_1)-(\Delta\xi_2+\Delta\xi_2)\}/(2D) \qquad (4)$$

$$\Delta\beta = \cos\phi\{(\Delta\xi_1-\Delta\eta_1)-(\Delta\xi_2-\Delta\eta_2)\}/(2D) \qquad (4)$$

where D is the distance between diffraction grating marks 102A, 102B on the reticle R in the direction Y, as shown in FIG. 17A, and $\phi$ is the generalized clockwise angle between the $\xi_1$ axis (which is parallel with the $\xi_2$) and the scanning direction (the direction X), as shown in FIG. 21.

Referring to FIG. 19, the main control system 132 drives the scanning stage 108 and the wafer stage 111 at a predetermined scanning speed by means of a reticle stage drive system 133 and a wafer stage drive system 135, respectively. The scanning operation of the scanning stage 108 and the scanning operation of the wafer stage 111 are carried out in accordance with the results of measurement by laser interferometers which are not shown, respectively. Further, the control system 132 controls the position and the rotating angle of the slightly movable stage 107 through the intermediary of the reticle stage control system 133 so as to allow the positional deviations $\Delta x$, $\Delta y$ between the reticle R and the wafer W, and the relative rotating angle $\Delta\theta$ between the reticle R and the wafer W, which are calculated with the use of the expressions (2) to (4), to fall into predetermined allowable ranges.

Further, a magnification adjusting mechanism 134 is provided in the projection optical system PL, for adjusting a spacial distance between predetermined parts of a lens group constituting the projection optical system PL or for adjusting the pressure in a predetermined gas tight chamber in the lens group in order to adjust the magnification of projection of the projection optical system PL. Accordingly, the error $\Delta\beta$ in magnification which is calculated with the use of the expression (5) is adjusted so as to approach zero by the main control system 132 which adjusts the magnification of projection of the projection optical system PL by means of the magnification adjusting mechanism 134. Thus, the reticle R and the wafer W are positionally aligned. It is noted that a mechanism which moves at least one of lens elements in the direction of the optical axis so as to adjust the magnification of projection, as disclosed in, for example U.S. Pat. No. 5,117,255, may be also used.

Referring to FIG. 16, as the exposure light IL, for example, pulse light from a pulse light source such as KrF excimer laser, or intermittent light which is obtained by intermitting continuous light from a mercury lamp or the like, can be used. Explanation will be hereinbelow made of the steps of projecting and exposing an image of the pattern 101 on the reticle R onto the shot area 104 on the wafer W.

[Step S1]

In a condition that the exposure light IL is not irradiated onto the reticle R, a first partial pattern 101a of the pattern 101 on the reticle R is shifted into the illumination area 103, and a first partial exposure area 104a of the shot area 104 is shifted into the exposure field 104a.

[Step S2]

A slightly movable stage 107 is slightly moved in accordance with reticle signals and wafer signals from the first and second alignment systems, or/and the first partial pattern 101a and the first partial exposure area 104 are positionally aligned with each other by adjusting the magnification of projection of the projection optical system PL. In this case, although the continuous diffraction grating marks 102A, 102B are formed in the scanning direction in the case shown in FIG. 17A, the positional detection can be made at only four points in the scanning direction within the diffraction grating marks 102A, 102B. Accordingly, instead of the continuous diffraction grating marks 102A, 102B, there can be used two cruciform pattern or the like which are incorporated in each of the partial patterns 101a to 101d. The same can be said to the diffraction grating marks 105A, 105B on the wafer W side.

[Step S3]

The exposure light IL is irradiated, and an image of the first partial pattern 101a is exposed onto the first partial exposure area 104a on the wafer W.

[Step S4]

Simultaneously with the completion of the first exposure, while monitoring the reticle signals and the wafer signals from the alignment systems, the scanning stage 108 is driven so as to shift a second partial pattern 101b on the reticle R, and the wafer stage 111 is driven so as to shift the second partial exposure area 104b of the shot area 104 into the exposure field 106. At this time, the shifting can be made while positionally aligning the wafer W and the reticle R with each other, that is, while maintaining a condition in which the image of the pattern 101 on the reticle R is superposed with the shot area 104 of the wafer W. In other words, the scanning speeds of the wafer W and the reticle R can be controlled so as to maintain a condition in which the image of the pattern 101 on the reticle R is superposed with the shot area 104 on the wafer W. Alternatively, after movement of the wafer stage 111 and the scanning stage 103, the final positional alignment can be made with the use of the slightly movable stage 107.

[Step S5]

The exposure light IL is irradiated in order that the image of the second partial pattern 101b on the reticle R is exposed onto the second partial exposure area 104b of the shot area 104.

Thereafter, with the repetitions of the step S4 and step S5, images of the partial patterns 101c, 101d on the reticle R are exposed onto the partial exposure areas 104c, 104d, respectively. Accordingly, even though the shot area 104 on the wafer W has been deformed by the process carried out until then, the superposition between the shot area 104 and the image of the pattern 101 on the reticle R can be maintained with a high degree of accuracy since the positional alignment is made for each of the partial exposure areas 104a to 104d which are obtained by finely segmenting the exposure area 104. Further, even though fluctuation in air on the optical path of the laser interferometer occurs, this fluctuation does not cause any error in the superposition since the final positional adjustment is made for the positional relationship between the diffraction grating marks 102A and 102B, and 105A and 105B.

Next, explanation will be hereinbelow made of an eighth embodiment of the present invention with reference to FIGS. 22 and 23. As to FIGS. 22 and 23, like reference numerals are used to denote like parts to those shown in FIGS. 19 and 17A so as to abbreviate detailed explanation thereto.

Figure 22:
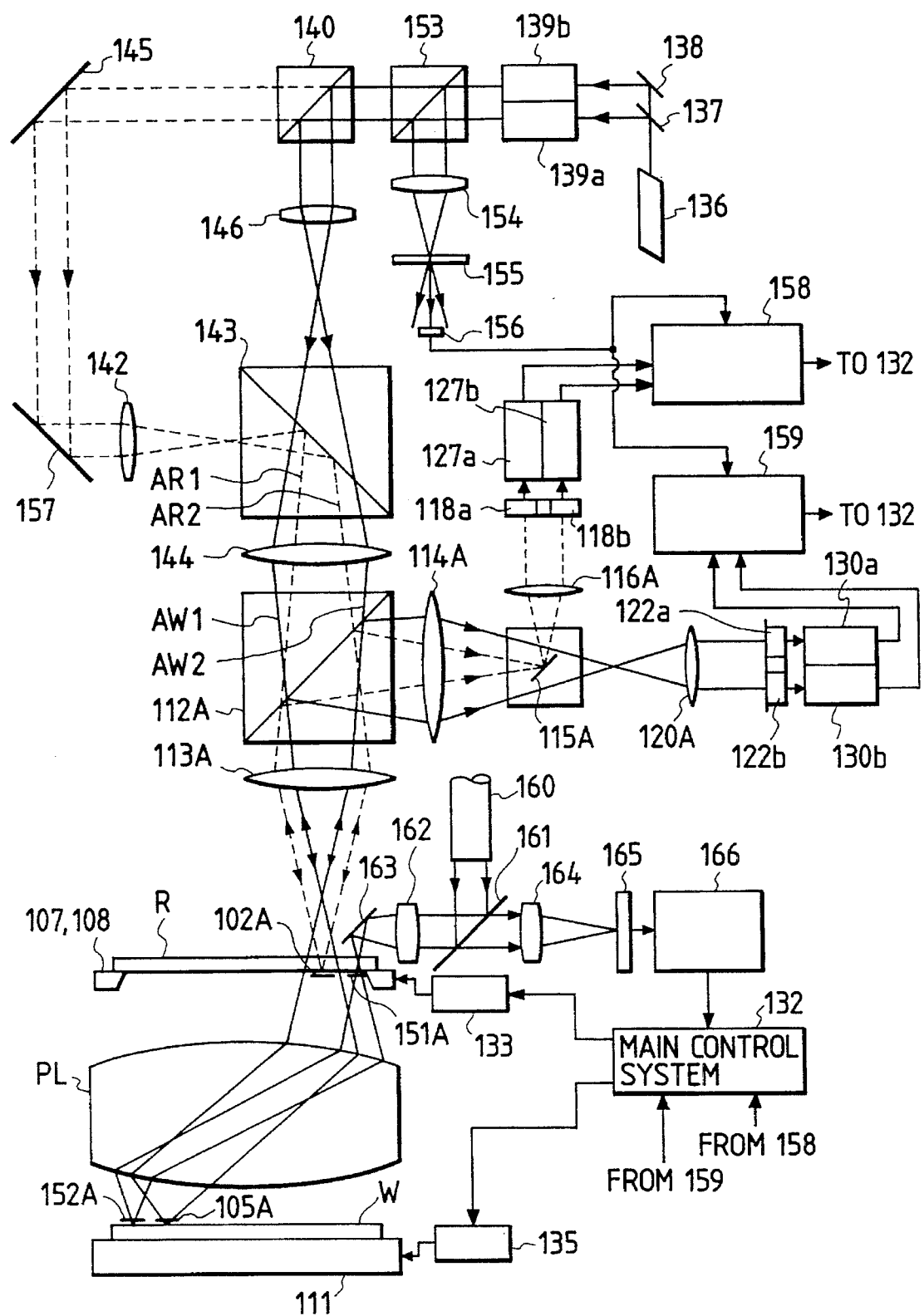
FIG. 22 is a schematic view illustrating a projection scanning exposure apparatus according to an eighth embodiment of the present invention.

Referring to FIGS. 22, two laser beams which are frequency-modulated by AOM 139a, 139b are in part reflected by a beam splitter 153, and are then irradiated onto a reference grating 155 by means of a focusing lens 154 with a predetermined crossing angle. The pitches of the reference grating 155 is set so that the +1-order diffracted light of the one of the two laser beams and the −1-order diffracted light of the other one of the two laser beams are emerged from the reference grating 155, perpendicular thereto. Further, the interference light between the +1-order diffracted light and the −1-order diffracted light is photoelectrically converted by the photoelectric detector 156, and accordingly, thus obtained reference signal having a frequency $\Delta f_1$ is delivered to the phase computers 158, 159.

Meanwhile, the two laser beams having passed through a beam splitter 153, reach a separation prism 140 in the light transmitting system. Reticle detecting beams AR1, AR2 having passed through the separation prism 140 in the light transmitting system is incident upon a beam synthesizing prism 143 in the light transmitting system by way of mirrors 145, 157 and a relay lens 142, and wafer detecting beams AW1, AW2 reflected by the separation prism 140 in the light transmitting system are incident upon the beam synthesizing prism 143 in the light transmitting system by way of a relay lens 146. Four laser beams which have been synthesized in the beam synthesizing prism 143, is directed to a transmitting and receiving separation prism 112A by way of an objective lent 144 in the light transmitting system.

It is noted that two group of interference light generated from the diffraction grating mark 102A on the reticle R is subjected to photoelectric conversion by light receiving elements 118a, 118b, and are delivered, as reticle signals, to phase detectors 127a, 127b, respectively, and phase data detected by the phase detectors 127a, 127b are delivered to a reticle side signal processing system 158. Similarly, two groups of interference light emitted from the diffraction grating mark 105A on the wafer W are subjected to photoelectric conversion by light receiving elements 122a, 122b, and are delivered as wafer signals to phase detectors 130a, 130b, and phase data detected by he phase detectors 130a, 130b are delivered to a wafer side signal processing system 159.

In the reticle side signal processing system 158, values of variation in the averaged value of the phase of the reticle signal is accumulated by using the phase of the reference signal as a reference, so as to obtain the shifting value (the component along the $\xi_1$ axis) of the diffraction grating mark 102A, which is then delivered to the main control system 132. Similarly, in the wafer side signal processing system 159, values of variation in the averaged value of the phase of the wafer signal are accumulated by using the phase of the reference signal as a reference, so as to obtain the shifting value (a component along an axis conjugate with the $\xi_1$ axis) of the diffraction grating mark 105A which is then delivered to the main control system 132. With the use of these shifting values, the main control system 132 controls the wafer stage 111, the scanning stage 108 and the slightly movable stage 107.

However, should the laser interferometer be removed from the wafer stage 111 or the scanning stage 108, a case such that the shifting to the initial position (or the exposure position of the first partial pattern) where the scanning is initiated, cannot be made with a high degree of accuracy possibly occurs. Since the search for the initial position where the scanning is initiated, is carried out, avoiding this matter, cruciform reference marks 151A, 151B are formed respectively on the diffraction grating marks 102A, 102B at one end thereof in the scanning direction (direction X as shown in FIG. 23). Further, reference marks which are not shown are formed respectively on the diffraction grating marks 105A, 105B on both sides of the shot area 104 shown in FIG. 18, at one end thereof.

Referring to FIG. 22, an image processing system for detecting the reference marks 151A on the reticle R and the reference mark 152A on the wafer W is provided in this embodiment. In this image processing system, a light guide 160 is adapted to lead a part of the exposure light IL branching from the illumination system for illuminating the pattern on the reticle R. Detection light in a wave band same as that of the exposure light emitted from the light guide 160 is reflected by the beam splitter, and thereafter, is focused onto the reference mark 151A on the reticle R by means of an objective lens 162 and a mirror 163 while detection light having passed around the reference mark 151A is focused onto the reference mark 152A on the wafer W by means of the projection optical system PL. Since this detection light has a wave band same as that of the exposure light, the reference mark 151A is conjugate with the reference mark 152A under the detection light.

The reflecting light from the reference mark 152A on the wafer W is returned into a position around the reference mark 151A on the reticle R by means of the projection optical system PL, and the reflecting light from the reference mark 151A and the reflecting light from the reference mark 152A form images of the reference marks 151A, 152A on the image pick-up surface of two dimensional image pick-up element (CCD or the like) 165 by way of the mirror 163, the objective lens 162, the beam splitter 161 and the image forming lens 164. An image pick-up signal from the image pick-up element 165 is delivered to an image pick-up signal processing system 166 which obtains a two-dimensional positional deviation between the reference marks 151A, 152A and delivers the same to the main control system 132. Similarly, an image processing system for obtaining a positional deviation between the other reference mark 151B shown in FIG. 23 and a reference mark corresponding thereto on the wafer W side is provided, and the thus obtained positional deviation is also delivered to the main control system 132.

Next, explanation will be made of the exposure operation of this embodiment. Even in this embodiment, the pattern 101 on the reticle R is divided into a plurality of partial patterns in the scanning direction, as shown in FIG. 17A, so as to perform exposure operation. In this case, during exposure of a first partial pattern, the reference marks 151A, 151B on the reticle R and two reference marks on the wafer W, corresponding to the former, are positionally aligned with each other by the image processing system, and thereafter, the final positional alignment is carried out with the use of the diffraction grating marks 102A, 102B on the reticle R and the diffraction grating marks 105A, 105B, similar to the above-mentioned seventh embodiment. Thereafter, with the use of data of the shifting values of the reticle R and the wafer W, given by the two alignment systems, the operation of the scanning stage 103, the slightly movable stage 107 and the wafer stage 111 is controlled. Accordingly, the alignment between the reticle R and the wafer W can be always and precisely made without using a laser interferometer. Accordingly, affection by fluctuation in air can be made to be less, and the degree of accuracy for the superposition can be maintained at a higher value even though partial deformation occurs in the wafer W.

Next, if the pattern 101 on the reticle R is continuously exposed onto the wafer W in this embodiment, the diffraction grating marks 102A, 102B on the reticle R are formed so as to be longer than the pattern 101 on the wafer W in the scanning direction. Similarly, the diffraction grating marks 105A, 105B on the wafer W are formed so as to be longer than the shot area. Further, the reference marks 151A, 151B on the reticle R are positionally aligned with two reference marks on the wafer W corresponding to the marks 151A, 151B, and thereafter, the final positional alignment is made with the use of the diffraction grating marks 102A, 102B on the reticle R and the diffraction grating marks 105A, 105B on the wafer W. Thereafter, the scanning with the reticle R and the wafer W is carried out so as to transfer the pattern 101 onto the wafer W so that the value which is obtained by multiplying the shifting value obtained from the diffraction grating marks 102A, 102B with the magnification of projection by the projection optical system PL becomes equal to the shifting value obtained from the diffraction grating marks 105A, 105B on the wafer W.

In this case, the reticle R and the wafer W are moved at the given scanning speed by the scanning stage 108 and the wafer stage 111, respectively, and a slight positional deviation is corrected by the slightly movable stage 107. In this case, the movement of the scanning stage 108 and the wafer stage 111 in the direction X is carried out by drive motors (such as linear motors) which has a wide operating range although it has a low response speed, and the drive of the slightly movable stage 107 is carried out by a piezo drive or the like which has a rapid response speed but has a narrow operating range. With this arrangement, it is possible to restrain the motor drive stages 111, 108 from being abruptly moved. Thus, the positional deviation between the wafer W and reticle R can be corrected by the slightly movable stage 107 while the motor driven stages 108, 111 are moved at a substantially constant speed, thereby it is possible to carry out the exposure with a high response speed in a wide range, and with a high degree of accuracy for superposition.

It is noted that although the slightly movable stage 107 is provided on the reticle R side in the above-mentioned embodiments 7, 8, the slight stage 107 may be provided on the wafer W side, or it may be provided on each of both sides. Further, in the above-mentioned embodiment, although the present invention is applied to the projection type exposure apparatus incorporating a projection optical system, the present invention can be of course applied to any of other apparatuses, such as a reflecting type projection exposure apparatus, a proximity type exposure apparatus and a contact type exposure apparatus.

What is claimed is:

1. An apparatus which transfers an original pattern formed on a mask to a predetermined area on a photosensitive substrate while moving said mask and said photosensitive substrate in synchronism with each other, comprising:

a projection optical system for projecting at least a portion of said original pattern on said photosensitive substrate;

a mask stage supporting said mask and movable in a predetermined direction perpendicular to an optical axis of said projection optical system;

a substrate stage supporting said photosensitive substrate and movable in said predetermined direction;

wherein said mask has a mask mark formed over substantially the entire range of a forming area of said original pattern along said predetermined direction, and said photosensitive substrate is provided with a substrate mark formed over substantially the entire range of said predetermined area along said predetermined direction;

a measuring device for measuring an amount of relative positional displacement between said mask mark and said substrate mark in said predetermined direction;

a first drive system for driving one of said mask stage and said substrate stage at a predetermined set speed in said predetermined direction during transfer of said original pattern to said predetermined area; and a second drive system for driving the other of said mask stage and substrate stage in said predetermined direction in such a manner that a positional displacement detected by said measuring device accompanying movement of said one stage is kept at a predetermined value.

2. An apparatus according to claim 1, wherein said measuring device includes a light irradiation system which irradiates each of said mask mark and said substrate mark with an illumination light and a photodetector which receives light from said mask mark and light from said substrate mark passing through said projection optical system.

3. An apparatus according to claim 1, wherein each of said mask mark and said substrate mark is a diffraction grating consisting of plural grating elements arranged along said predetermined direction, and wherein said measuring device includes a light irradiation system which radiates two beams onto said mask mark and radiates two beams onto said substrate mark through said projection optical system, and a photodetector which receives diffracted light produced from said mask mark and diffracted light produced from said substrate mark passing through said projection optical system.

4. An apparatus according to claim 3, wherein said light irradiation system includes a light source producing a beam, a splitter which splits said beam from said light source into two and an objective optical system which emits said two split beams toward said mask mark.

5. An apparatus according to claim 4, wherein said light irradiation system includes a frequency shifter which is disposed between said splitter and said objective optical system and provides a predetermined frequency difference between said two split beams.

6. An apparatus according to claim 5, wherein said first drive system drives said one stage at a speed different from a moving speed of an interference fringe formed by said two split beams when a moving direction of said one stage is accorded with said moving direction of said interference fringe.

7. An apparatus which transfers an original pattern formed on a first substrate to a predetermined area on a second substrate, wherein said first substrate is provided with a first mark formed over substantially the entire range of a forming area of said original pattern along a predetermined direction and said second substrate is provided with a second mark formed over substantially the entire range of said predetermined area along said predetermined direction, said apparatus comprising:

a measuring device for measuring an amount of relative positional displacement between said first and second marks in said predetermined direction;

a first drive system for moving one of said first and second substrates at a constant speed in said predetermined direction during transfer of said original pattern to said predetermined area; and a second drive system for moving the other of said first and second substrates in said predetermined direction dependent on an amount of a positional displacement detected by said measuring device during movement of said one substrate.

8. A method for transferring an original pattern formed on a first substrate to a predetermined area on a second substrate, wherein said first substrate is provided with a first mark formed over substantially the entire range of a forming area of said original pattern along a predetermined direction and said second substrate is provided with a second mark formed over substantially the entire range of said predetermined area along said predetermined direction, said method comprising:

moving one of said first and second substrates at a constant speed in said predetermined direction during transfer of said original pattern to said predetermined area; and moving the other of said first and second substrates in said predetermined direction in such a manner that an amount of positional displacement between said first and second marks in said predetermined direction is kept at a predetermined value, by measuring said amount of positional displacement between said first and second marks in said predetermined direction during movement of said one substrate.

9. An apparatus which transfers an original pattern formed on a mask to a predetermined area on a photosensitive substrate while moving said mask and said photosensitive substrate in synchronism with each other, comprising:

a projection optical system which projects at least a portion of said original pattern on said photosensitive substrate;

a mask stage supporting said mask and movable in a predetermined direction perpendicular to an optical axis of said projection optical system;

a substrate stage supporting said photosensitive substrate and movable in said predetermined direction;

wherein said mask is provided with first and second mask marks formed on opposite sides of said original pattern over substantially the entire range of a forming area of said original pattern along said predetermined direction, and said photosensitive substrate is provided with first and second substrate marks formed on opposite sides of said predetermined area over substantially the entire range of said predetermined area along said predetermined directions;

a measuring device for measuring an amount of relative positional displacement between each of said first and second mask marks and each of said first and second substrate marks corresponding to each of said mask marks in said predetermined direction;

a first drive system driving one of said mask stage and said substrate stage at a predetermined set speed in said predetermined direction during transfer of said original pattern to said predetermined area;

a second drive system driving the other of said mask stage and said substrate stage in said predetermined direction in such a manner that an amount of positional displacement detected by said measuring device accompanying movement of said one stage is kept at a predetermined value; and a rotation device for relatively rotating said mask and said photosensitive substrate on the basis of an amount of positional displacement detected by said measuring device.

10. An apparatus which transfers an original pattern formed on a mask to a predetermined area on a photosensitive substrate while moving said mask and said photosensitive substrate in synchronism with each other, comprising:

a projection optical system projecting at least a portion of said original pattern on said photosensitive substrate;

a mask stage supporting said mask and movable in a first direction perpendicular to an optical axis of said projection optical system;

a substrate stage supporting said photosensitive substrate and movable in said first direction;

wherein said mask is provided with a first mask grating consisting of plural grating elements arranged in said first direction and a second mask grating consisting of plural grating elements arranged in a second direction perpendicular to said first direction, each mask grating extending over substantially the entire range of a forming area of said original pattern, and said photosensitive substrate is provided with a first substrate grating consisting of plural grating elements arranged in said first direction and a second substrate grating consisting of plural grating elements arranged in said second direction, each substrate grating extending over substantially the entire range of said predetermined area;

a measuring device measuring a first amount of positional displacement between said first mask grating and said first substrate grating in said first direction and measuring a second amount of positional displacement between said second mask grating and said second substrate grating in said second direction;

a first drive system for driving one of said mask stage and said substrate stage at a predetermined set speed in said first direction during transfer of said original pattern to said predetermined area;

a second drive system for driving the other of said mask stage and said substrate stage in said first direction in such a manner that said first amount of positional displacement detected by said measuring device accompanying movement of said one stage is kept at a predetermined value; and a third drive system for relatively moving said mask and said photosensitive substrate in said second direction in such a manner that said second amount of positional displacement detected by said measuring device is kept at a predetermined value.

11. An apparatus which transfers an original pattern formed on a mask to a predetermined area on a photosensitive substrate while moving said mask and said photosensitive substrate in synchronism with each other, comprising:

a projection optical system for projecting at least a portion of said original pattern on said photosensitive substrate;

a mask stage supporting said mask and movable in a predetermined direction perpendicular to an optical axis of said projection optical system;

a substrate stage supporting said photosensitive substrate and movable in said predetermined direction;

a drive device for driving said mask stage and said substrate stage in synchronism with each other;

wherein said mask is provided with a mask grating consisting of plural grating elements arranged in said predetermined direction over substantially the entire range of a forming area of said original pattern, and said photosensitive substrate is provided with a substrate grating consisting of plural grating elements arranged in said predetermined direction over substantially the entire area of said predetermined area;

a measuring device for measuring an amount of positional displacement between said mask grating and said substrate grating in said predetermined direction, the measuring device including a light irradiation system which radiates two beams having a predetermined frequency difference on each of said mask grating and said substrate grating, and a photodetector which receives diffracted light produced from said mask grating and diffracted light produced from said substrate grating; and a regulator which changes frequency of at least one of said two beams according to a drive condition of said substrate stage and said mask stage when said original pattern is transferred to said predetermined area.

12. An apparatus according to claim 11, wherein said drive device includes a first drive system for moving one of said mask stage and said substrate stage at a constant speed in said predetermined direction and a second drive system for moving the other of said mask stage and said substrate stage in said predetermined direction on the basis of an amount of positional displacement detected by said measuring device accompanying movement of said one stage.

13. An apparatus according to claim 11, wherein said light irradiation system includes a light source producing a beam, a splitter for splitting the beam from said light source into two, and a frequency shifter for providing said predetermined frequency difference between said two split beams, and said regulator includes a drive circuit for driving said frequency shifter in such a manner that frequency of at least one of said two split beams is changed.

14. An apparatus according to claim 13, wherein said drive circuit drives said frequency shifter in such a manner that a frequency of a photoelectric signal produced from said photodetector becomes greater than said predetermined frequency difference.

15. An apparatus according to claim 11, wherein said light irradiation system includes a light source producing a beam, a splitter for splitting the beam from said light source into two, and two sets of frequency shifters disposed in each of optical paths of said two split beams and providing said predetermined frequency difference between said two beams, and said regulator includes a switching unit for changing over each of frequencies of said two beams.

16. An apparatus according to claim 15, wherein said regulator includes a driver unit for changing over said switching unit according to the moving direction of said mask stage or said substrate stage.

17. An apparatus which transfers an original pattern formed on a mask to a predetermined area on a photosensitive substrate while moving said mask and said photosensitive substrate in synchronism with each other, wherein said mask is provided with a first grating formed over substantially the entire range of a forming area of said original pattern along a predetermined direction and said photosensitive substrate is provided with a second grating formed over substantially the entire range of said predetermined area along said predetermined direction, said apparatus comprising:

a detector for detecting an amount of positional displacement between first and second gratings during movement of said mask and said photosensitive substrate, the detector including a light irradiation system for radiating two beams having a predetermined frequency difference on each of said first and second gratings and a photodetector for receiving diffracted light produced from said first grating and diffracted light produced from said second grating; and a regulator for changing frequency of at least one of said two beams according to movement conditions of said mask and said photosensitive substrate.

18. An apparatus according to claim 17, further comprising a correction device for correcting a relative positional relation between said mask and said photosensitive substrate according to an amount of positional displacement detected by said detector during the movement of said mask and said photosensitive substrate.

19. An apparatus for transferring an original pattern formed on a mask, onto a predetermined area on a photosensitive substrate, comprising:

a projection optical system for projecting at least a part of said original pattern onto said photosensitive substrate;

a mask stage carrying thereon said mask and being movable in a predetermined direction perpendicular to the axis of said projection optical system;

a movable member for moving said mask, relative to the mask stage;

a substrate stage for holding said photosensitive substrate so as to move the same in said predetermined direction;

a first system for driving said mask stage and said substrate stage with a speed ratio in dependence upon a magnification of projection of said projection optical system;

wherein said mask has a mask mark formed over a substantially entire range of an area where said original pattern is formed, along said predetermined direction, and said photosensitive substrate has a substrate mark formed over a substantially entire range of said predetermined area along said predetermined direction;

a measuring device for measuring a relative positional deviation between said mask mark and said substrate mark; and a second system for driving said movable member so as to maintain said relative positional deviation measured by said measuring device at a predetermined value while said mask stage and said substrate stage are driven.

20. An apparatus for transferring an original pattern formed on a first substrate onto a predetermined area on a second substrate, comprising:

a projection optical system for projecting at least a part of said original pattern onto said second substrate;

a driving system for moving said first substrate and said second substrate along said predetermined direction with a speed ratio in dependence upon a magnification of projection of said projection optical system;

a movable member for changing relative positional relationship between said first and second substrates, irrespective of movement by said drive system;

wherein said first substrate has a first mask mark formed over a substantially entire range of an area where said original pattern is formed, along said predetermined direction, and said second substrate has a second mark formed over a substantially entire range of said predetermined area along said predetermined direction;

a measuring device for measuring a relative positional deviation between said first and second marks; and a controller for controlling movement of said movable member so as to maintain said positional deviation measured by said measuring device at a predetermined value while said first and second substrates are moved.

21. An apparatus according to claim 20, wherein said measuring device includes a first stage which carries thereon said first substrate, and which is movable in said predetermined direction, and a second stage which carries thereon said second substrate, and which is movable in said predetermined direction; and said movable member is provided to at least one of said first and second stages.

22. An apparatus according to claim 21, wherein said movable member has a slightly movable stage which is provided to one of said first and second stages so as to hold one of said first and second substrates, which is loaded on said one of said first and second stages, for moving said one substrate, relative to said one stage.

23. An apparatus for transferring an original pattern formed on a mask, onto a predetermined area on a photosensitive substrate, comprising:

a projection optical system for projecting at least a part of said original pattern onto said photosensitive substrate;

a mask stage carrying thereon said mask and being movable in a predetermined direction perpendicular to the axis of said optical system;

a substrate stage for holding said photosensitive substrate, which is movable in said predetermined direction;

wherein said mask has mask marks which are incorporated respectively to a plurality of partial patterns constituting said original pattern and arranged in said predetermined direction, and said photosensitive substrate has substrate marks which are incorporated respectively to a plurality of partial areas constituting the said predetermined area and arranged in said predetermined direction;

a device for measuring a relative positional deviation between a mask mark incorporated to one of said plurality of partial patterns and a substrate mark incorporated to one of said plurality of partial areas, onto which said one of partial patterns is transferred; and a movable member for moving said mask and said photosensitive substrate, relative to each other, so as to maintain the positional deviation measured by said measuring device at a predetermined value, when said mask stage and said substrate stage are successively moved in order to transfer said original pattern onto said predetermined area.

24. A scanning exposure apparatus comprising:

a measuring system for measuring a positional deviation between a mask and a substrate in a predetermined direction;

a first driving system for moving one of said mask and said substrate at a constant speed in said predetermined direction during scanning exposure; and a second driving system for moving the other of said mask and said substrate in said predetermined direction dependent on a positional deviation detected by said measuring system during said scanning exposure.

25. An apparatus according to claim 24, wherein said measuring system includes an illumination system for radiating two beams on each of a first grating on said mask and a second grating on said substrate, a first photodetector which receives diffracted light from said first grating, and a second photodetector which receives diffracted light from said second grating.

26. An apparatus according to claim 25, wherein said measuring system includes a frequency shifter which provides a predetermined frequency difference between said two beams, and a detector which detects phase difference between signals from said first and second photodetectors.

27. A scanning exposure apparatus comprising:

a measuring system for radiating two beams having a predetermined frequency difference on each of a first grating on a mask and a second grating on a substrate so as to detect a positional deviation between said first and second gratings during scanning exposure; and a regulator for changing frequency of at least one of said two beams according to scanning conditions of said mask and said substrate.

\* \* \* \* \*